(12) United States Patent
Yang et al.

(10) Patent No.: US 12,057,423 B2
(45) Date of Patent: Aug. 6, 2024

(54) BUMP INTEGRATION WITH REDISTRIBUTION LAYER

(71) Applicant: Taiwan Semiconductor Manufacturing Co., Ltd., Hsinchu (TW)

(72) Inventors: Ting-Li Yang, Tainan (TW); Po-Hao Tsai, Zhongli (TW); Ching-Wen Hsiao, Hsinchu (TW); Hong-Seng Shue, Zhubei (TW); Ming-Da Cheng, Taoyuan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 106 days.

(21) Appl. No.: 17/492,126

(22) Filed: Oct. 1, 2021

(65) Prior Publication Data

US 2022/0246565 A1 Aug. 4, 2022

Related U.S. Application Data

(60) Provisional application No. 63/145,613, filed on Feb. 4, 2021.

(51) Int. Cl.
*H01L 23/00* (2006.01)
*H01L 21/768* (2006.01)
(Continued)

(52) U.S. Cl.
CPC ........ *H01L 24/11* (2013.01); *H01L 21/76816* (2013.01); *H01L 23/5223* (2013.01);
(Continued)

(58) Field of Classification Search
None
See application file for complete search history.

(56) References Cited

U.S. PATENT DOCUMENTS 10,515,911 B2 12/2019 Chun et al.
11,075,173 B2 7/2021 Tseng et al.
(Continued)

FOREIGN PATENT DOCUMENTS

KR 20100120224 A 11/2010
KR 20160054886 A 5/2016
(Continued)

*Primary Examiner* — Hung K Vu
(74) *Attorney, Agent, or Firm* — Slater Matsil, LLP

(57) ABSTRACT

A method of forming a semiconductor device includes: forming an interconnect structure over a substrate; forming a first passivation layer over the interconnect structure; forming a first conductive feature over the first passivation layer and electrically coupled to the interconnect structure; conformally forming a second passivation layer over the first conductive feature and the first passivation layer; forming a dielectric layer over the second passivation layer; and forming a first bump via and a first conductive bump over and electrically coupled to the first conductive feature, where the first bump via is between the first conductive bump and the first conductive feature, where the first bump via extends into the dielectric layer, through the second passivation layer, and contacts the first conductive feature, where the first conductive bump is over the dielectric layer and electrically coupled to the first bump via.

20 Claims, 21 Drawing Sheets

(51) Int. Cl.
*H01L 23/522* (2006.01)
*H01L 23/528* (2006.01)

(52) U.S. Cl.
CPC ...... *H01L 23/5226* (2013.01); *H01L 23/5283* (2013.01); *H01L 24/16* (2013.01); *H01L 2224/11019* (2013.01); *H01L 2224/13008* (2013.01); *H01L 2924/19041* (2013.01)

(56) References Cited

U.S. PATENT DOCUMENTS

| | | | |
|---|---|---|---|
| 2008/0122078 A1 | 5/2008 | He et al. | |
| 2008/0284016 A1 | 11/2008 | Huang et al. | |
| 2009/0315180 A1* | 12/2009 | Lee | H01L 23/5329 257/E23.161 |
| 2011/0254159 A1 | 10/2011 | Hwang et al. | |
| 2013/0043583 A1 | 2/2013 | Wu et al. | |
| 2014/0048952 A1* | 2/2014 | Lee | H01L 24/03 257/774 |
| 2014/0166961 A1* | 6/2014 | Liao | H10N 70/8833 257/4 |
| 2018/0294255 A1 | 10/2018 | Liu | |
| 2020/0294948 A1 | 9/2020 | Lin et al. | |

FOREIGN PATENT DOCUMENTS

| | | |
|---|---|---|
| KR | 20200050417 A | 5/2020 |
| TW | 201901823 A | 1/2019 |

\* cited by examiner

BUMP INTEGRATION WITH REDISTRIBUTION LAYER

PRIORITY CLAIM AND CROSS-REFERENCE

This application claims the benefit of the U.S. Provisional Application No. 63/145,613, filed Feb. 4, 2021 and entitled "Bumps Integrated with Cu RDL," which application is hereby incorporated herein by reference.

BACKGROUND

High-density integrated circuits, such as Very Large Scale Integration (VLSI) circuits, are typically formed with interconnect structures (also referred to as interconnects) serving as three-dimensional wiring line structures. The purpose of the interconnect structures is to properly connect densely packed devices together to form functional circuits. With increasing levels of integration, a parasitic capacitance effect between the metal lines of the interconnects, which leads to RC delay and cross-talk, increases correspondingly. In order to reduce the parasitic capacitance and increase the conduction speed of the interconnections, low-k dielectric materials are commonly employed to form Inter-Layer Dielectric (ILD) layers and Inter-Metal Dielectric (IMD) layers.

Metal lines and vias are formed in the IMD layers. A formation process may include forming an etch stop layer over first conductive features, and forming a low-k dielectric layer over the etch stop layer. The low-k dielectric layer and the etch stop layer are patterned to form a trench and a via opening. The trench and the via opening are then filled with a conductive material, followed by a planarization process to remove excess conductive material, so that a metal line and a via are formed. Conductive bumps, such as micro-bumps (μ-bumps) and controlled collapse chip connection bumps (C4 bumps), are formed over the interconnect structures for connection with other devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
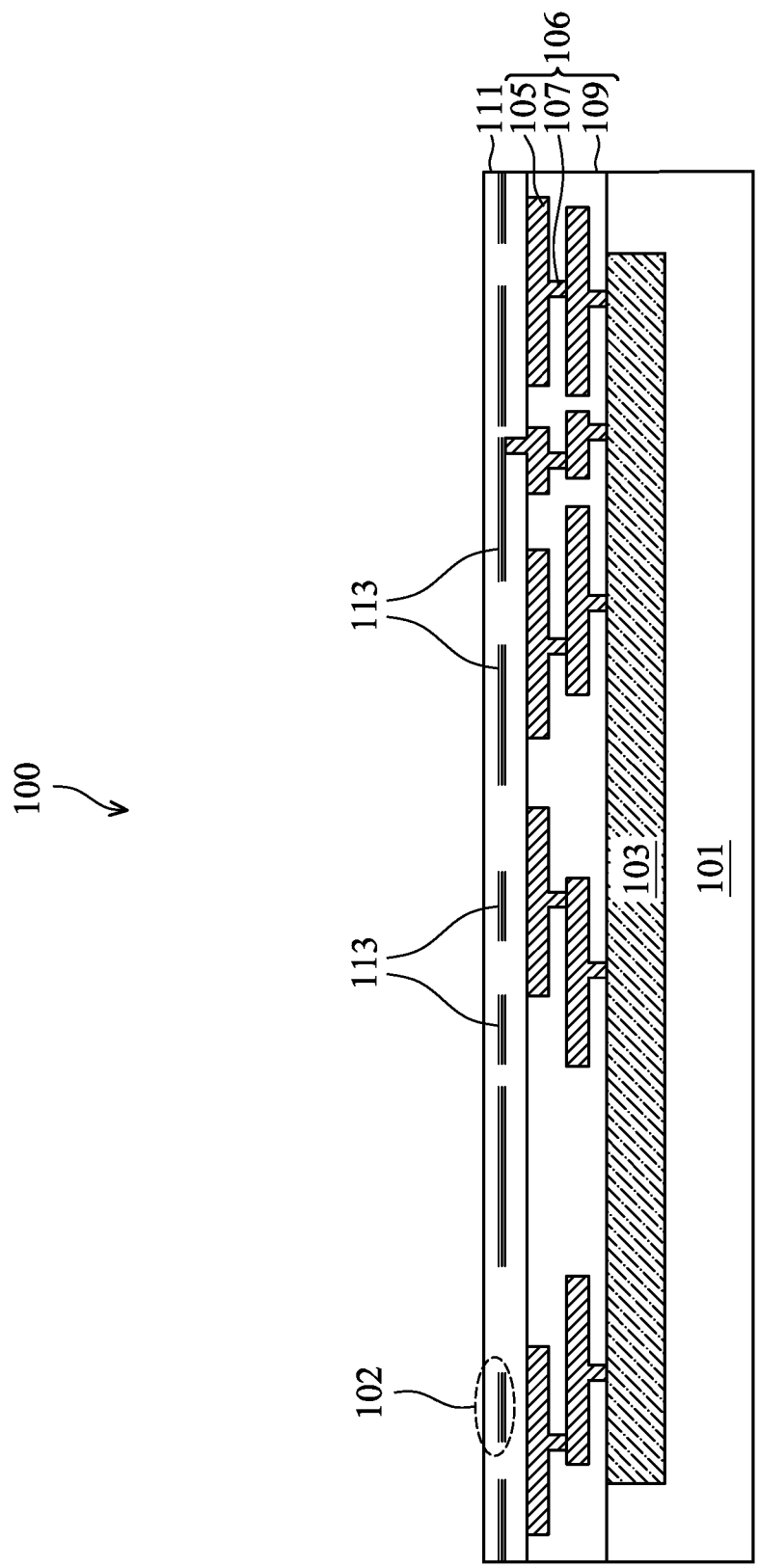
FIGS. 1A, 1B, 2-7, and 8A-8C illustrate cross-sectional views of a semiconductor device at various stages of manufacturing, in accordance with an embodiment.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Throughout the description herein, unless otherwise specified, the same or similar reference numerals in different figures refer to the same or similar element formed by a same or similar formation method using a same or similar material(s). In addition, unless otherwise specified, figures with the same numeral and different alphabets (e.g., FIG. 8A and FIG. 8B) illustrate different views (e.g., along different cross-sections) of the same semiconductor device at the same stage of manufacturing.

In accordance with an embodiment, a conductive bump (e.g., a C4 bump or a μ-bump) is formed in a lined-up opening or a pulled-in opening in dielectric layers over a conductive feature (e.g., a conductive pad, or a conductive line). A conformal passivation layer is formed over the conductive feature, and a dielectric layer is formed over the conformal passivation layer. The lined-up opening or the pulled-in opening is formed to extend through the dielectric layer and the passivation layer to expose the underling conductive feature, and the conductive bump is then formed in the lined-up opening or the pulled-in opening on the conductive feature. The lined-up opening or the pulled-in opening increases the adhesion between the passivation layer and the dielectric layer, and reduces stress at the interface between the passivation layer and the dielectric layer. As a result, delamination at the interface between the passivation layer and the dielectric layer is avoided or reduced. By forming the dielectric layer over the passivation layer as a planarization layer, issues such as bump seed layer step coverage and discontinuity are avoided or reduced, thereby increasing device reliability and production yield.

FIGS. 1A, 1B, 2-7, and 8A-8C illustrate cross-sectional views of a semiconductor device 100 at various stages of manufacturing, in accordance with an embodiment. The semiconductor device 100 may be a device wafer including active devices (e.g., transistors) and/or passive devices (e.g., capacitors, inductors, resistors, or the like). In some embodiments, the semiconductor device 100 is an interposer wafer, which may or may not include active devices and/or passive devices. In accordance with yet another embodiment of the present disclosure, the semiconductor device 100 is a package substrate strip, which may be package substrates with cores therein or may be core-less package substrates. In subsequent discussion, a device wafer is used as an example of the semiconductor device 100. The teaching of the present disclosure may also be applied to interposer wafers, package substrates, or other semiconductor structures, as skilled artisans readily appreciate.

As illustrated in FIG. 1A, the semiconductor device 100 includes a semiconductor substrate 101 and electrical components 103 (e.g., transistors, resistors, inductors, or the like) formed on or in the semiconductor substrate 101 (may also be referred to as substrate 101). The semiconductor substrate 101 may include a semiconductor material, such as silicon, doped or undoped, or an active layer of a semiconductor-on-insulator (SOI) substrate. The semiconductor substrate 101 may include other semiconductor materials, such as germanium; a compound semiconductor including silicon carbide, gallium arsenic, gallium phosphide, gallium nitride, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used.

In the example of FIG. 1A, electrical components 103 are formed in a device region of the semiconductor substrate 101. Examples of the electrical components 103 include transistors (e.g., Complementary Metal-Oxide Semiconductor (CMOS) transistors), resistors, capacitors, diodes, and the like. The electrical components 103 may be formed using any suitable method, details are not discussed here.

In some embodiments, after the electrical components 103 are formed, an Inter-Layer Dielectric (ILD) layer is formed over the semiconductor substrate 101 and over the electrical components 103. The ILD layer may fill spaces between gate stacks of the transistors (not shown) of the electrical components 103. In accordance with some embodiments, the ILD layer comprises silicon oxide, phosphosilicate glass (PSG), borosilicate glass (BSG), boron-doped phosphosilicate glass (BPSG), fluorine-doped silicate glass (FSG), or the like. The ILD layer may be formed using spin coating, Flowable Chemical Vapor Deposition (FCVD), Plasma Enhanced Chemical Vapor Deposition (PECVD), Low Pressure Chemical Vapor Deposition (LPCVD), or the like.

Contact plugs are formed in the ILD layer, which contact plugs electrically couple the electrical components 103 to conductive features (e.g., metal lines, vias) of subsequently formed interconnect structure 106. Note that in the present disclosure, unless otherwise specified, a conductive feature refers to an electrically conductive feature, and a conductive material refers to an electrically conductive material. In accordance with some embodiments, the contact plugs are formed of a conductive material such as tungsten, aluminum, copper, titanium, tantalum, titanium nitride, tantalum nitride, alloys thereof, and/or multi-layers thereof. The formation of the contact plugs may include forming contact openings in the ILD layer, forming one or more conductive material(s) in the contact openings, and performing a planarization process, such as a Chemical Mechanical Polish (CMP), to level the top surface of the contact plugs with the top surface of the ILD layer.

Still referring to FIG. 1A, an interconnect structure 106 is formed over the ILD layer and over the electrical components 103. The interconnect structure 106 comprises a plurality of dielectric layers 109 and conductive features (e.g., metal lines, vias) formed in the dielectric layers 109. In some embodiments, the interconnect structure 106 interconnects the electrical components 103 to form functional circuits of the semiconductor device 100.

In some embodiments, each of the dielectric layers 109, which may also be referred to as an Inter-Metal Dielectric (IMD) layer, is formed of a dielectric material such as silicon oxide, silicon nitride, silicon carbide, silicon oxynitride, or the like. In accordance with some embodiments, the dielectric layers 109 are formed of a low-k dielectric material having a dielectric constant (k-value) lower than 3.0, such as about 2.5, about 2.0, or even lower. The dielectric layers 109 may comprise a carbon-containing low-k dielectric material, Hydrogen SilsesQuioxane (HSQ), MethylSilsesQuioxane (MSQ), or the like. The formation of each of the dielectric layers 109 may include depositing a porogen-containing dielectric material over the ILD layer, and then performing a curing process to drive out the porogen, thereby forming the dielectric layer 109 that is porous, as an example. Other suitable method may also be used to form the dielectric layers 109.

As illustrated in FIG. 1A, conductive features, such as conductive lines 105 and vias 107, are formed in the dielectric layers 109. In an example embodiment, the conductive features may include a diffusion barrier layer and a conductive material (e.g., copper, or a copper-containing material) over the diffusion barrier layer. The diffusion barrier layer may include titanium, titanium nitride, tantalum, tantalum nitride, or the like, and may be formed by CVD, Physical Vapor Deposition (PVD), Atomic Layer Deposition (ALD), or the like. After the diffusion barrier layer is formed, the conductive material is formed over the diffusion barrier layer. The formation of the conductive features may include a single damascene process, a dual damascene process, or the like.

Next, a passivation layer 111 is formed over the interconnect structures 106, and a plurality of metal-insulator-metal (MIM) capacitors 113 are formed in the passivation layer 111. The passivation layer 111 may include a plurality of sub-layers (see, e.g., 111A-111E in FIG. 1B) and may be formed of one or more suitable dielectric materials such as silicon oxide, silicon nitride, low-k dielectrics such as carbon doped oxides, extremely low-k dielectrics such as porous carbon doped silicon dioxide, combinations of these, or the like. The passivation layer 111 may be formed through a process such as chemical vapor deposition (CVD), FVCD, although any suitable process may be utilized.

Figure 1B:
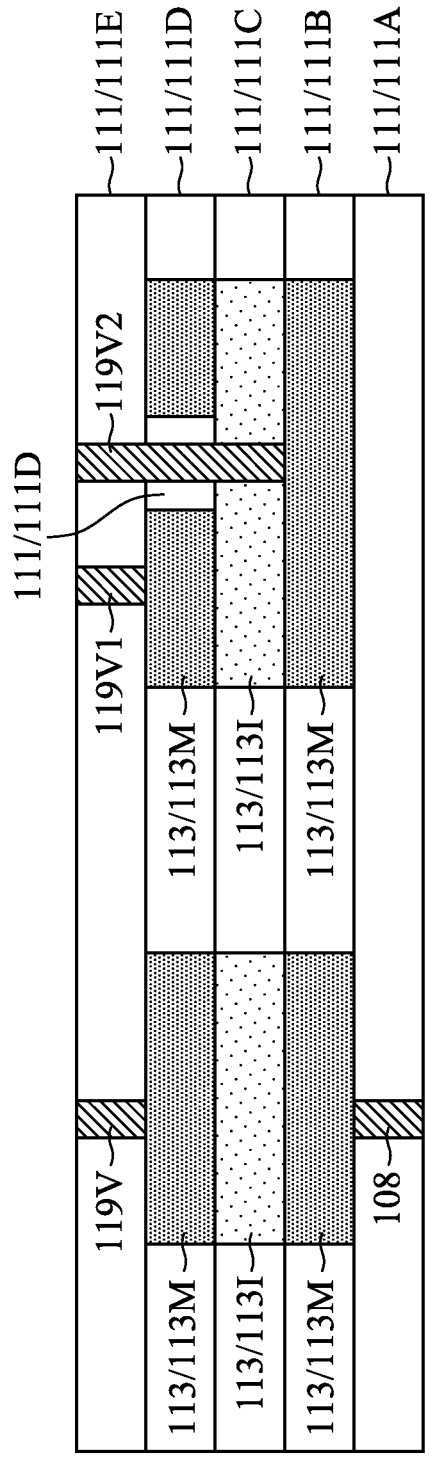

The MIM capacitors 113 are formed in the passivation layers 111. FIG. 1B illustrates a zoomed-in view of an area 102 in FIG. 1A to show details of the MIM capacitors 113. As illustrated in FIG. 1B, each of the MIM capacitors 113 includes two metal layers 113M (e.g., copper layers) and a dielectric layer 113I (e.g., a high-k dielectric layer) between the metal layers 113M. Each of the layers (e.g., 113M, 113I, and 113M) of the MIM capacitor 113 is formed in a respective passivation layer (e.g., 111B, 111C, or 111D). The upper metal layer 113M and the lower metal layer 113M of the MIM capacitor 113 may be connected to an overlying via 119V and an underlying via 108, respectively, where the overlying via 119V and the underlying via 108 are formed in passivation layers 111E and 111A, respectively, as an example. As another example, the upper metal layer 113M and the lower metal layer 113M of the MIM capacitor 113 may be connected to a first overlying via 119V1 and a second overlying via 119V2, respectively. In the example of FIG. 1B, the second overlying via 119V2 extends through the passivation layer 111D and the dielectric layer 113I to connect with the lower metal layer 113M. Note that the second overlying via 119V2 extends through an opening in the upper metal layer 113M of the MIM capacitor, and therefore, is separated from (e.g., not contacting) the upper metal layer 113M of the MIM capacitor by portions of the passivation layer 111D.

Referring back to FIG. 1A, the lower meta layer of the MIM capacitor 113 may be electrically coupled to a conductive feature of the interconnect structure 106, e.g., through a via that extends from the lower metal layer of the MIM capacitor 113 to the conductive feature of the interconnect structure 106. In addition, the plurality of MIM capacitors 113 may be electrically coupled in parallel to provide a large capacitance value. For example, the upper metal layers of the MIM capacitors 113 may be electrically coupled together, and the lower metal layers of the MIM capacitors 113 may be electrically coupled together. In some embodiments, the MIM capacitors 113 are omitted.

Figure 2:
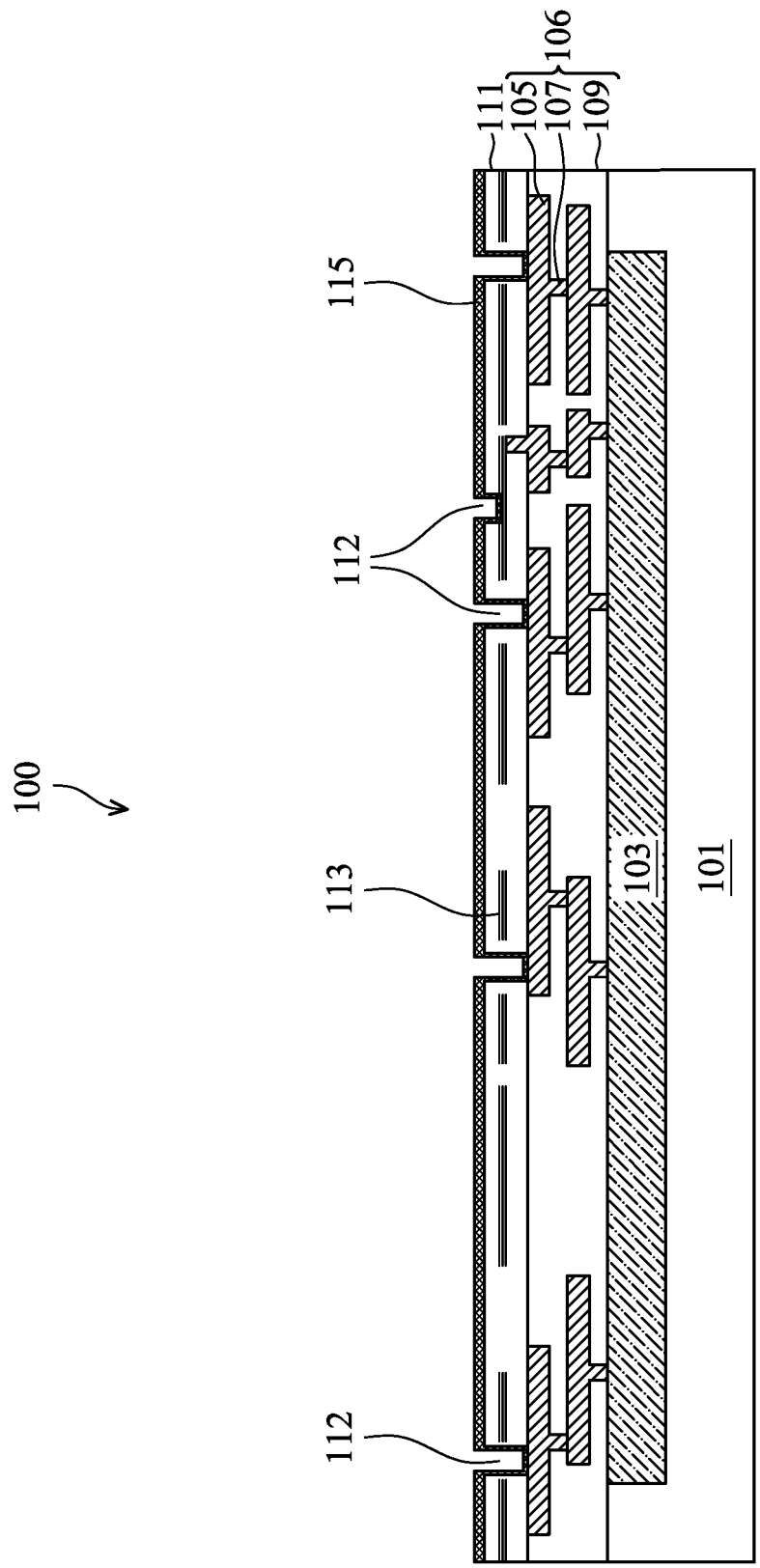

Referring next to FIG. 2, openings 112 are formed in the passivation layer 111. Some of the openings 112 extend through the passivation layer 111 to expose conductive features of the interconnect structure 106. In some embodiments, some of the openings 112 extend partially through the passivation layer 111 to expose the upper metal layers of the MIM capacitors 113. The openings 112 may be formed in one or more etching processes (e.g., anisotropic etching processes).

After the openings 112 are formed, a barrier layer 115 is formed conformally over the upper surfaces of the passivation layer 111 and along sidewalls and bottoms of the openings 112. The barrier layer 115 may have a multi-layer structure and may include a diffusion barrier layer (e.g., a TiN layer) and a seed layer (e.g., a copper seed layer) formed over the diffusion barrier layer. The barrier layer 115 may be formed using any suitable formation method(s), such as CVD, PVD, ALD, combinations thereof, or the like.

Figure 3:
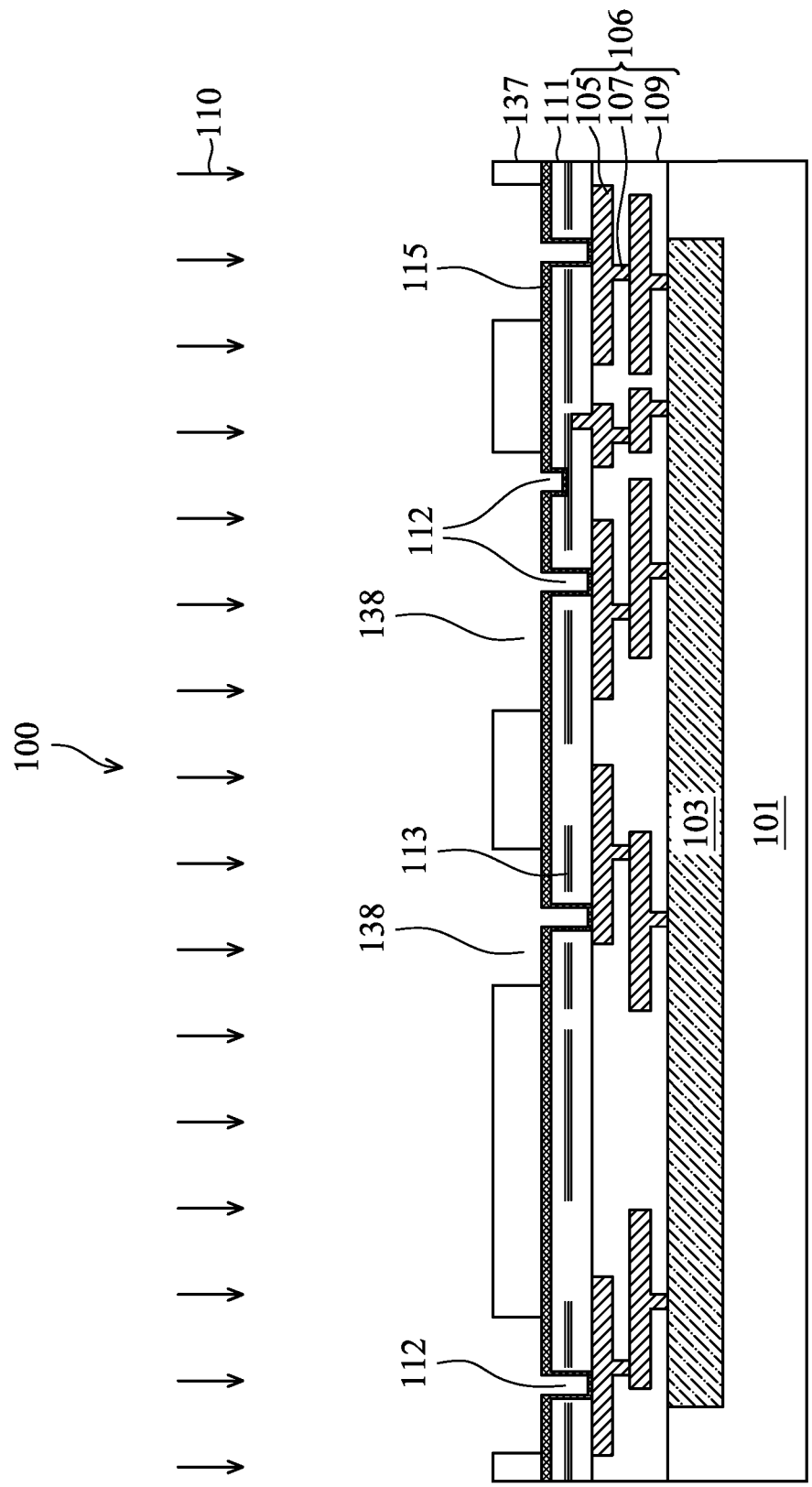

Next, in FIG. 3, a photoresist layer 137 is formed over the barrier layer 115. The photoresist layer 137 is patterned (e.g., using photolithography technique) to form opening 138 at locations where conductive pads 119 (see FIG. 4) will be formed. The openings 138 expose, e.g., the seed layer of the barrier layer 115. After the openings 138 are formed, a descum process 110 is performed to clean residues left by the patterning process of the photoresist layer 137. The descum process 110 may be a plasma process performed using a process gas comprising oxygen, as an example.

Figure 4:
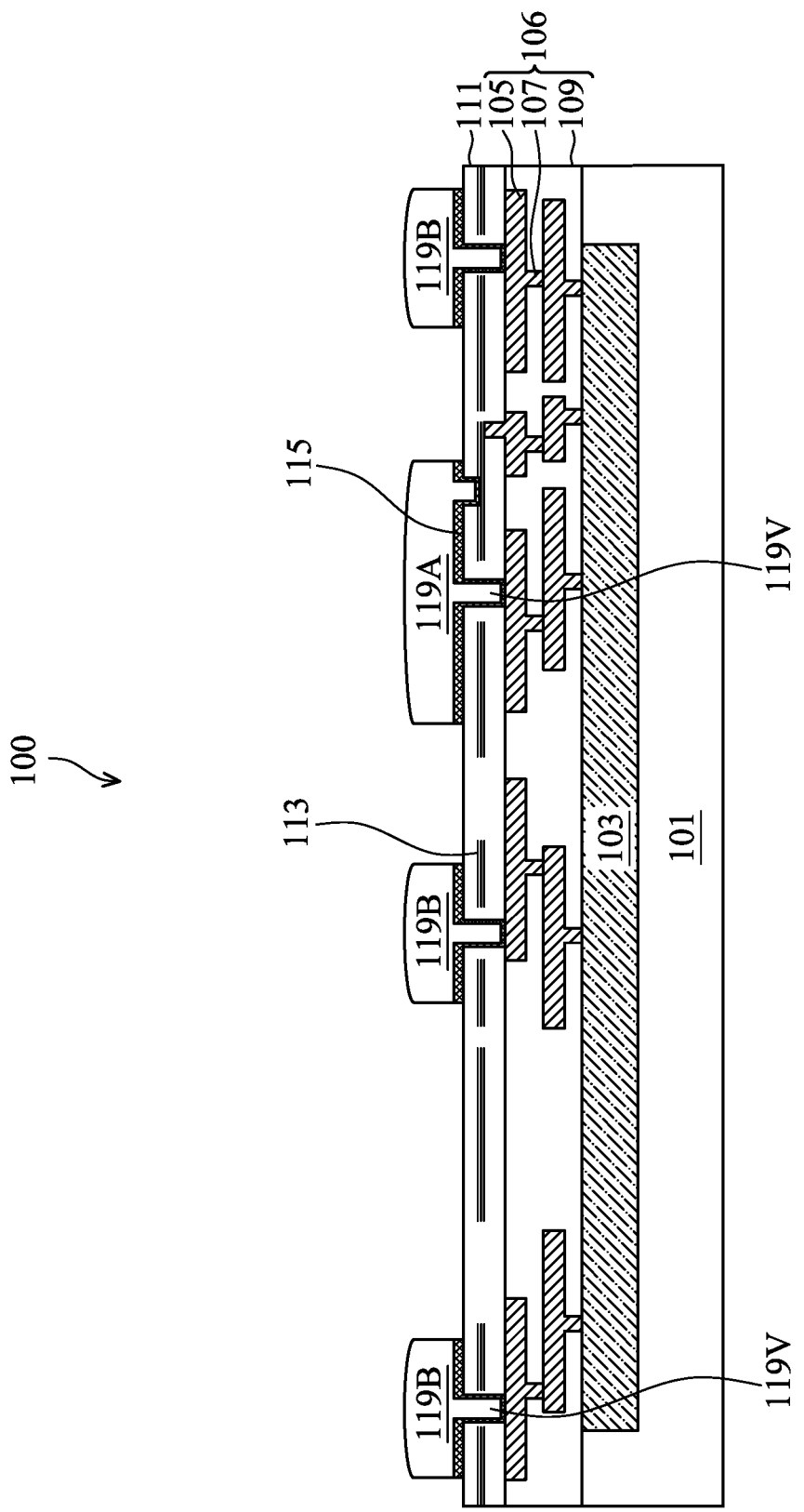

Next, in FIG. 4, conductive pads 119 (e.g., 119A and 119B) are formed in the openings 138 over the barrier layer 115. The conductive pads 119 may comprise an electrically conductive material, such as copper or copper alloy (e.g., a copper-silver alloy, a copper-cobalt alloy, or the like), and may be formed using a suitable formation method such as electroplating, electroless plating, or the like. After the conductive pads 119 are formed, the photoresist layer 137 is removed by a suitable removal process, such as ashing. Next, an etching process is performed to remove portions of the barrier layer 115 on which the conductive pads 119 are not formed. As illustrated in FIG. 4, portions of the electrically conductive material fill the openings 112 (see FIG. 3) in the passivation layer 111 to form vias 119V, which vias 119V electrically couple the conductive pads 119 to underlying conductive features of the interconnect structure 106 and/or the MIM capacitor 113. Note that in the discussion herein, the barrier layer 115 in the openings 112 is considered part of the vias 119V, and the barrier layer 115 over the upper surface of the passivation layer 111 is considered part of the conductive pads 119. Although not shown in FIG. 4, conductive lines (e.g., copper lines) may also be formed on the upper surface of the passivation layer 111 (see, e.g., 118 in FIG. 12) during the same processing steps to form the conductive pads 119. The conductive pads 119 and the conductive lines may be collectively referred to as a redistribution layer (RDL), and the vias 119V may be referred to as RDL vias. The shape of the cross-section of the conductive pad 119 may be a dome shape (e.g., with a curved upper surface), a concave shape, a polygon shape, or a rectangular (or square) shape, as examples. An area of the RDL via 119V may be between about 0.9×0.9 $\mu m^2$ and about 3.5×3.5 $\mu m^2$, as an example.

Note that in FIG. 4, some of the conductive pads 119 (e.g., 119A) are larger (e.g., having a larger width measured between opposing sidewalls) than other conductive pads 119 (e.g., 119B). In some embodiments, controlled collapse chip connection bumps (C4 bumps) are formed on the larger conductive pads 119A, and micro-bumps (μ-bumps) are formed on the smaller conductive pads 119B. The number of conductive pads 119 may be any suitable number, and may be arranged in any order, as skilled artisans readily appreciate. In addition, although one RDL via 119V is illustrated under each conductive pad 119 in FIG. 4, the number of RDL vias 119V under each of the conductive pad 119 may be any suitable number, such as one, two, three, or more. Furthermore, the RDL vias 119V under each of the conductive pads 119 may be centered with respect to the conductive pad 119, or may be off-center with respect to the conductive pad 119.

Figure 5:
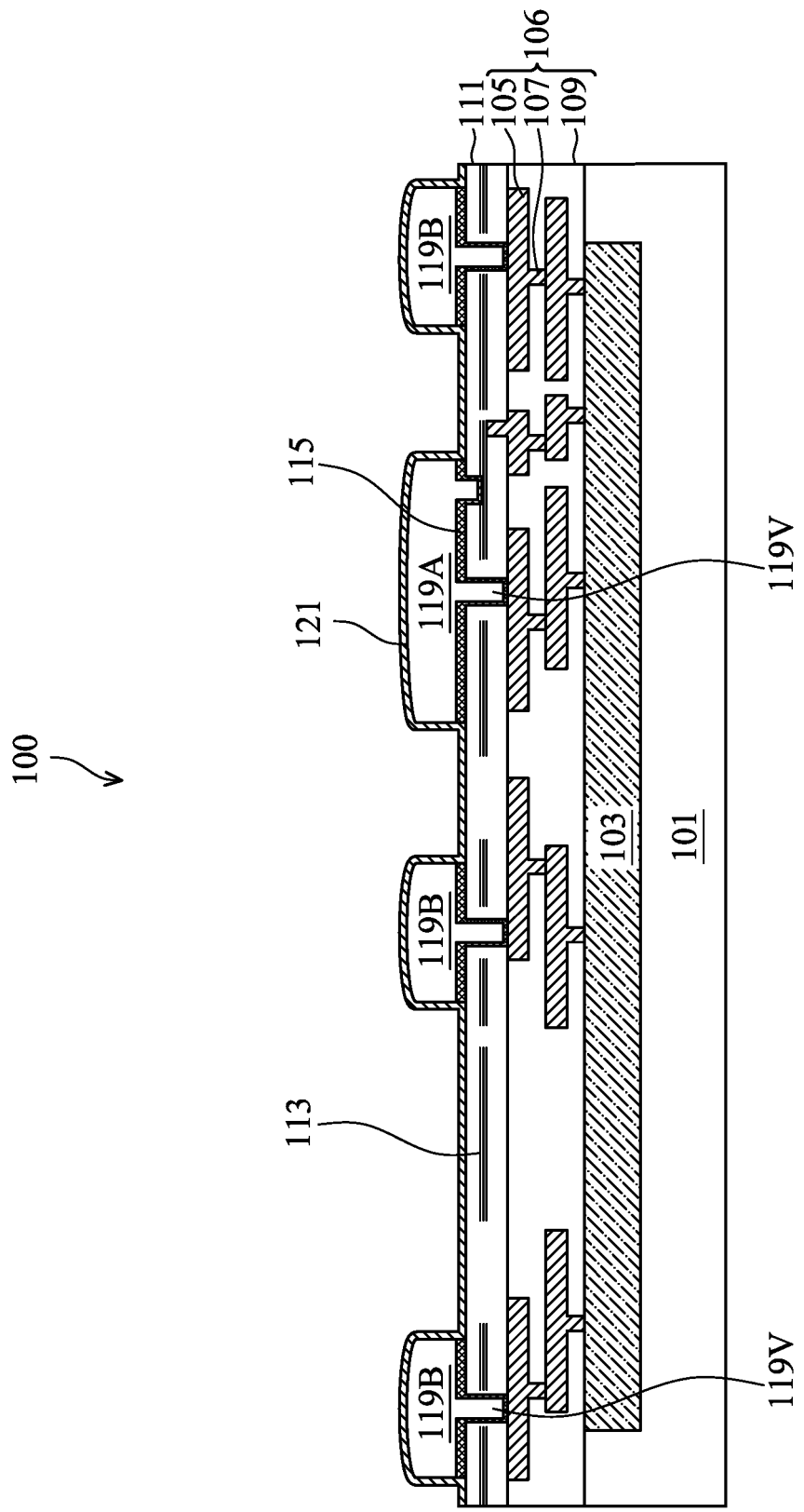

Next, in FIG. 5, a passivation layer 121 is conformally formed over the conductive pads 119 and over the passivation layer 111. In some embodiments, the passivation layer 121 has a multi-layered structure and includes an oxide layer (e.g., silicon oxide) and a nitride layer (e.g., silicon nitride) over the oxide layer. In other embodiments, the passivation layer 121 has a single layer structure, e.g., having a single nitride layer. The passivation layer 121 may be formed using, e.g., CVD, PVD, ALD, combinations thereof, or the like.

Figure 6:
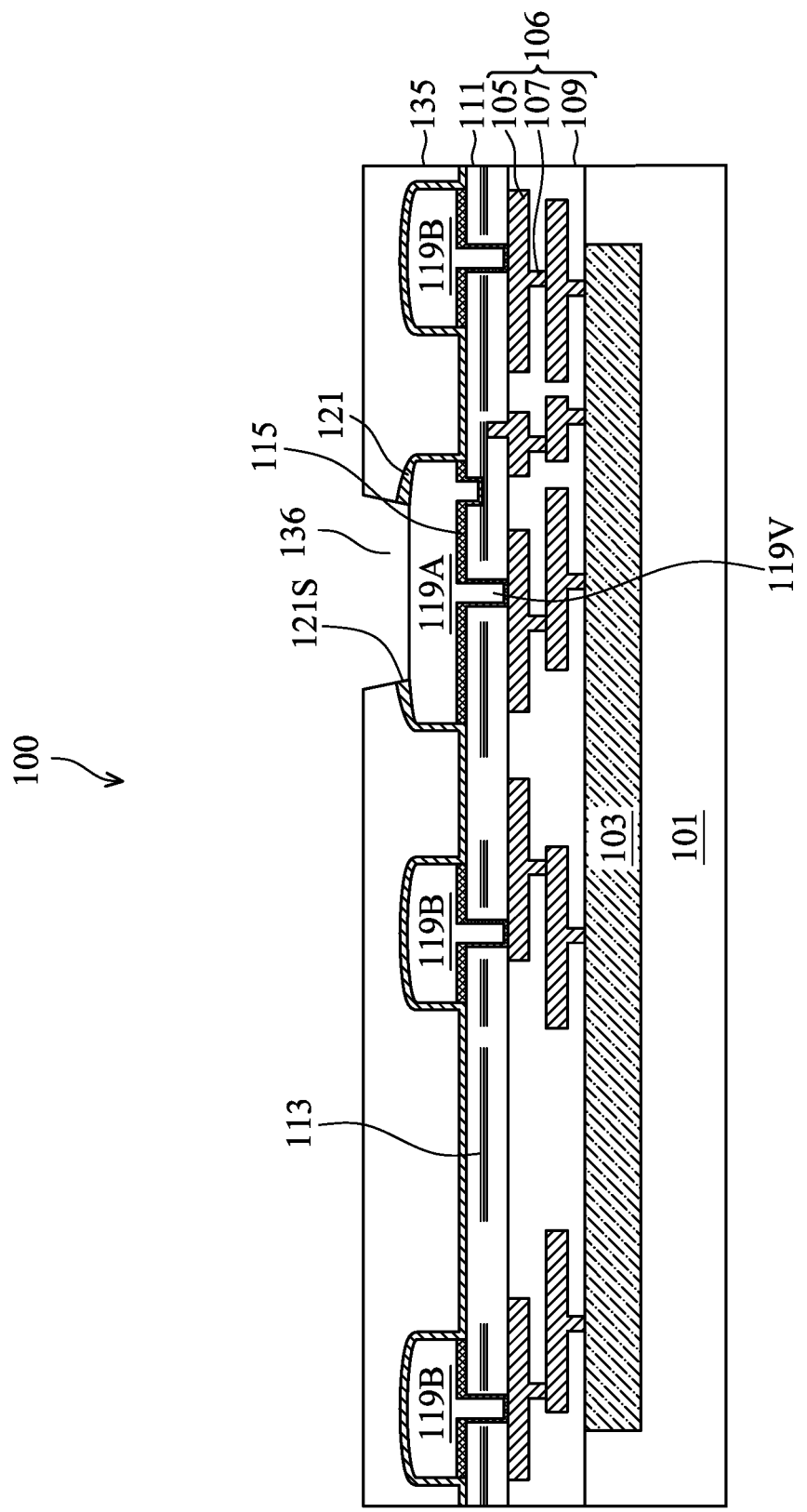

Next, in FIG. 6, a photoresist layer 135 is formed over the passivation layer 121 by, e.g., spin coating. The photoresist layer 135 is then patterned by, e.g., photolithography techniques to form openings 136 at locations where conductive bumps will be formed. Next, an etching process is performed to remove portions of the passivation layer 121 exposed by the openings 136. In some embodiments, the etching process is a dry etch process (e.g., a plasma etching process) using a process gas comprising a mixture of $CF_4$, $CHF_3$, $N_2$, and Ar. Other process gas may also be used, e.g., $O_2$ may be used in place of CF4. After the etching process, the conductive pads 119 are exposed. Next, the photoresist layer 135 is removed by a suitable removal process, such as ashing. Note that for simplicity, only one opening 136 is illustrated in FIG. 6 over the larger conductive pad 119A for forming the conductive bump 125 (see FIG. 8A), and no openings are formed over the other conductive pads (e.g., 119B). This is, of course, merely a non-limiting example. One skilled in the art will readily appreciate that the same or similar processing steps may be performed to form conductive bumps over the other conductive pads (e.g., 119B).

Figure 7:
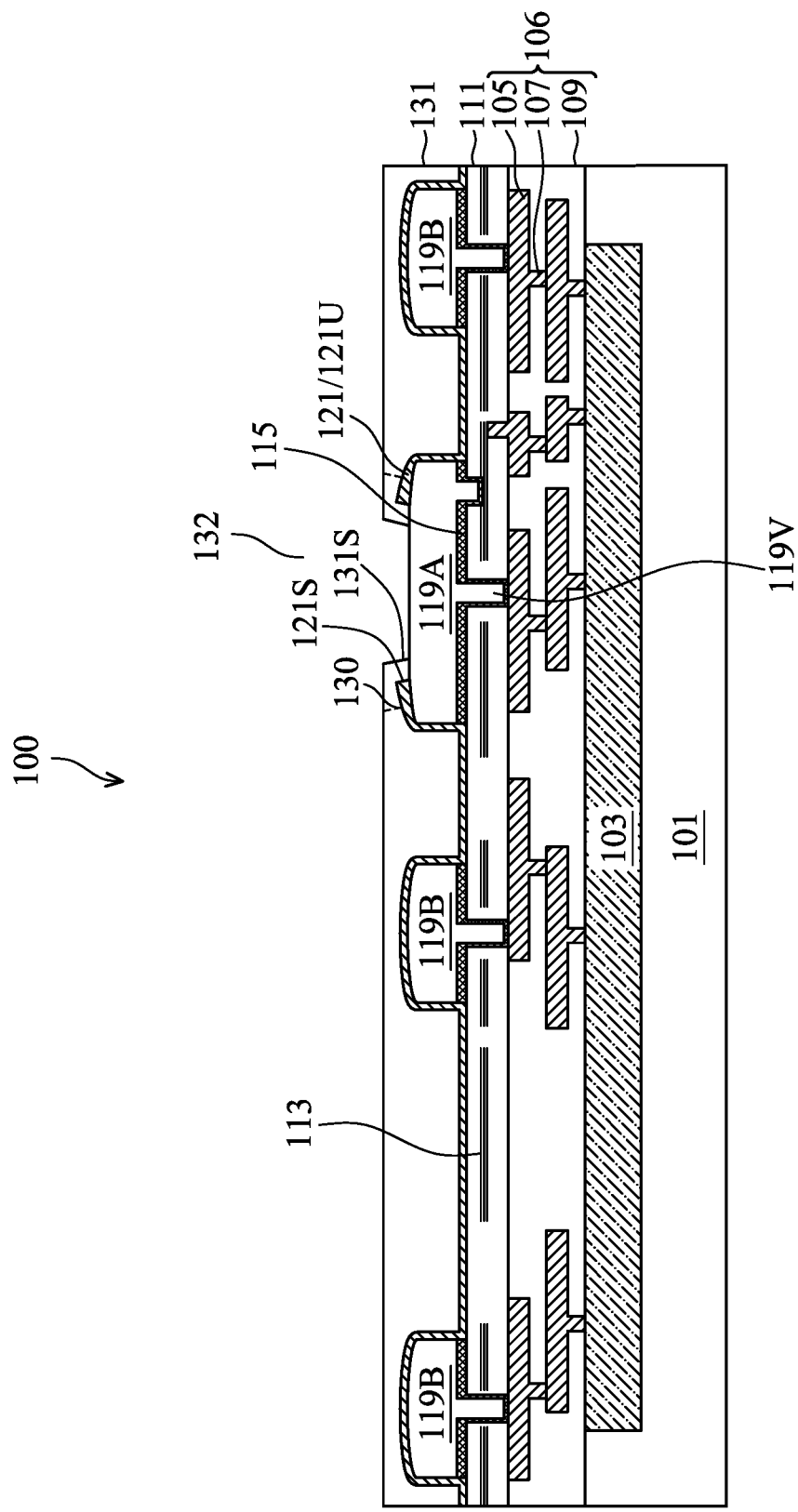

Next, in FIG. 7, a dielectric layer 131 is formed over the passivation layer 121, over the conductive pads 119, and over the passivation layer 111. Openings 132 are formed in the dielectric layer 131 to expose the underlying conductive pads 119. The dielectric layer 131 may be formed of, e.g., polymer, polyimide (PI), benzocyclobutene (BCB), an oxide (e.g., silicon oxide), or a nitride (e.g., silicon nitride). The dielectric layer 131 is illustrated as a single layer in FIG. 7 as a non-limiting example. The dielectric layer 131 may have a multi-layer structure that includes a plurality of sub-layers formed of different dielectric materials.

In some embodiments, the dielectric layer 131 is a photosensitive material such as a photosensitive polymer material, and the openings 132 are formed by using photolithography techniques. For example, the photosensitive material may be exposed to a patterned energy source (e.g., light) through, e.g., a reticle. The impact of the energy causes a chemical reaction in those portions of the photosensitive material that were impacted by the patterned energy source, thereby modifying the physical properties of the exposed portions of the photosensitive material such that the physical properties of the exposed portions of the photosensitive material are different from the physical properties of the unexposed portions of the photosensitive material. The photosensitive material may then be developed with a developer to remove the exposed portion of the photosensitive material or the unexposed portion of the photosensitive material, depending on, e.g., whether a negative photosensitive material or a positive photosensitive material is used. The remaining portions of the photosensitive material may be cured to form a patterned dielectric layer 131. The top corners of the dielectric layer 131 at the openings 132 are illustrated to be sharp (e.g., comprising two intersecting lines) in FIG. 7 as a non-limiting example. The top corners of the dielectric layer 131 at the openings 132 may be, e.g., rounded corners.

In FIG. 7, a first distance between opposing sidewalls 131S of the dielectric layer 131 exposed by the opening 132 is smaller than a second distance between opposing sidewalls 121S of the passivation layer 121 exposed by the opening 136 in FIG. 6. In other words, the opening 132 in the dielectric layer 131 is narrower than the opening 136 in the passivation layer 121, such that the upper surfaces 121U and the sidewalls 121S of the passivation layer 121 are completely covered by the dielectric layer 131. Since the dielectric layer 131 is pulled-in from the sidewalls 121S of the passivation layer 121, the opening 132 in FIG. 7 is referred to as a pulled-in opening. The sidewall 131S of the dielectric layer 131 is illustrated to have a linear profile (e.g., a slanted line, or a flat sidewall slanted with respect to the major upper surface of the substrate 101) in FIG. 7 as a non-limiting example. The sidewall 131S may be a straight line (e.g., perpendicular to a major upper surface of the substrate 101), or a curved line. A width of the opening 132 (e.g., a distance measured between opposing sidewalls 131S) may be constant, or may change continuously (e.g., gradually without a step change) along a depth direction of the opening 132.

The pulled-in opening 132 improves device reliability and production yield compared to a pulled-out opening. In a pulled-out opening, the sidewalls 131S of the dielectric layer 131 would be pulled out from the opening 132 to locations indicated by the dashed lines 130 in FIG. 7. In other words, if the opening 132 were formed as a pulled-out opening, the width of the opening 132 would be larger than the width of the opening 136 in FIG. 6. When pulled-out openings are formed, the mechanical stress at an interface between the dielectric layer 131 and the passivation layer 121 in areas near the dashed lines 130 (e.g., between portions of the dielectric layer 131 over the conductive pad 119 and portions of the passivation layer 121 over the conductive pad 119) is much higher than other areas of the device. The increased stress may cause delamination of the layers of materials in the high stress areas, thereby causing device failure and lowering production yield. In addition, in subsequent processing to form the seed layer 126 (see FIG. 8A) for forming conductive bumps 125, the pulled-out opening may be more challenging for forming a conformal, continuously seed layer 126 that lines the sidewalls and bottoms of the pulled-out opening, due to the pulled-out opening having more step shapes to be covered by the conformal seed layer 126. This is referred to as the bump seed layer step coverage issue. The bump seed layer step coverage issue may cause discontinuity (e.g., holes) in the seed layer 126, which in turn may cause defects in the conductive bump 125 formed thereon. The current disclosure, by forming pulled-in openings for forming the conductive bumps 125, avoids or reduces the above described issues, thereby improving device reliability and production yield. Note that besides pulled-in openings, lined-up openings (see, e.g., lined-up opening 136 in FIG. 10 and the discussion thereof) offer the same or similar advantage as the pulled-in openings. In some embodiments, the openings (e.g., 132, 136) used to form the conductive bumps 125 are pulled-in openings and/or lined-up openings, and no pulled-out openings are formed for forming the conductive bumps 125.

Figure 8A:
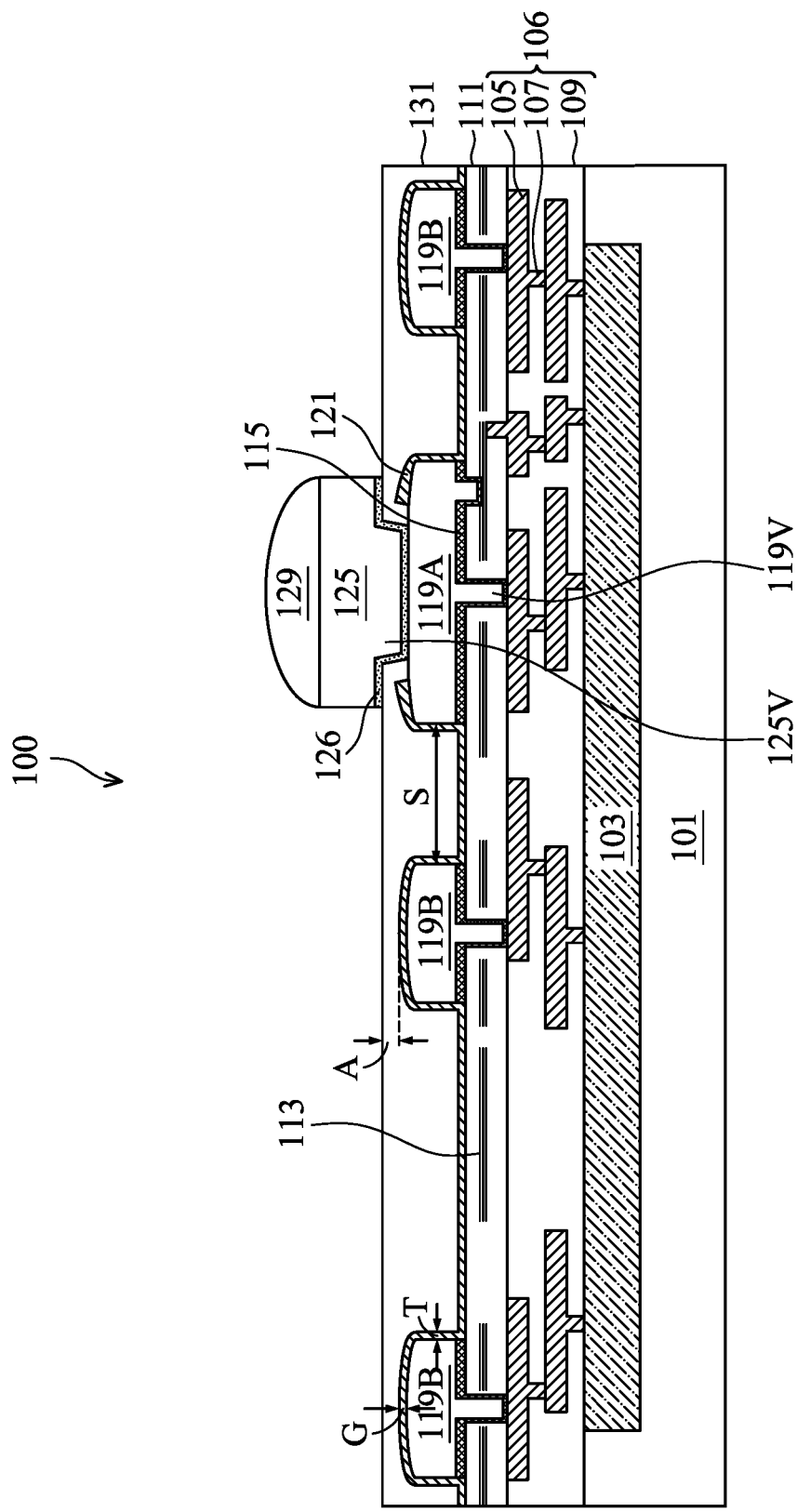

Next, in FIG. 8A, conductive bumps 125 are formed on the conductive pads 119, and solder regions 129 are formed on the conductive bumps 125. A width of the conductive bump 125 may be between about 5 μm and about 90 μm. The conductive bumps 125 may be μ-bumps or C4 bumps. For example, μ-bumps having a width (e.g., measured between opposing sidewalls) between, e.g., about 5 μm and about 30 μm may be formed over the conductive pads 119B, and C4 bumps having a width between about 32 μm and about 90 μm may be formed over the conductive pads 119A. Each of the μ-bumps and the C4 bumps is formed in a pulled-in opening 132 (see FIG. 7) formed over a respective conductive pad 119, in an example embodiment.

The conductive bumps 125 may be formed by forming a seed layer 126 over the dielectric layer 131 and along sidewalls and bottoms of the openings 132; forming a patterned photoresist layer over the seed layer 126, where openings of the patterned photoresist layer are formed at locations where the conductive bumps 125 are to be formed; forming (e.g., plating) an electrically conductive material (e.g., copper) over the seed layer 126 in the openings; removing the patterned photoresist layer; and removing portions of the seed layer 126 over which no conductive bump 125 is formed. Note that portions of the electrically conductive material fill the openings 132 to form bump vias 125V, which bumps vias 125V electrically couple the conductive bumps 125 to the underlying conductive pads 119. Note that in the discussion herein, the seed layer 126 in the openings 132 (see FIG. 7) is considered part of the bump vias 125V, and the seed layer 126 over the upper surface of the dielectric layer 131 is considered part of the conductive bump 125. FIG. 8A shows an interface between the seed layer 126 and the electrically conductive material (e.g., copper) of the conductive bump 125 as an example. In some embodiments, the seed layer 126 and the electrically conductive material of the conductive bump 125 are formed of a same material, thus there may not be an interface in between.

In FIG. 8A, the number of bump vias 125V under (e.g., directly under) each conductive bump 125 is one. This is, of course, merely a non-limiting example. The number of bump vias 125V under a respective conductive bump 125 may be any suitable number, such as one, two, three, or more. In addition, the one or more bump vias 125V under each conductive bump 125 may be centered with respect to the conductive bump 125, or may be off-center with respect to the conductive bump 125.

In FIG. 8A, sidewalls of the bump via 125V contact (e.g., physically contact) and extend along sidewalls of the dielectric layer 131. The width of the bump via 125V may be constant (e.g., having sidewalls perpendicular to a major upper surface of the substrate 101) or may change continuously (e.g., gradually without a step change, or without a dis-continuous change) as the bump via 125V extends toward the substrate 101. In the example of the FIG. 8A, the sidewalls of the bump via 125V have a liner profile (e.g., a slanted straight line), and the width of the bump via 125V decreases continuously as the bump via 125V extends toward the substrate 101. The sidewalls of the bump via 125V may have a curved profile (e.g., a curved line), e.g., when the sidewalls 131S of the dielectric layer 131 exposed by the opening 132 (see FIG. 7) have curved profiles. Note that there is a gap between the sidewall of the bump via 125V and a respective sidewall of the passivation layer 121, and the dielectric layer 131 fills the gap and contacts the upper surface of the conductive pads 119A. In other words, the bump via 125V is spaced apart (e.g., separated) from the passivation layer 121 by a portion of the dielectric layer 131 disposed laterally between the bump via 125V and the passivation layer 121.

In the example of FIG. 8A, a thickness A of a portion of the dielectric layer 131 disposed over the passivation layer 121 on the conductive pad 119 is between about 1 μm and about 20 μm. A space S between adjacent smaller conductive pads 119B (e.g., with μ-bumps formed thereon) is larger than about 1.5 μm, and a space S between adjacent larger conductive pads 119A (e.g., with C4 bumps formed thereon) is larger than about 4 μm. FIG. 8A also illustrates a thickness T for sidewall portions of the passivation layer 121 (e.g., portions along sidewalls of the conductive pad 119 or along sidewalls of the conductive line 118 in FIG. 16A), and a thickness G for upper portions of the passivation layer 121 (e.g., portions along upper surfaces of the conductive pad 119 or along upper surfaces of the conductive line 118), where the thickness G is between about 0.5 μm and about 5 μm, and where a ratio between T and G (e.g., T/G), referred to as the step coverage of the passivation layer 121, is between about 20% and about 95%. In some embodiments, a pitch P between adjacent conductive bumps 125 is between about 10 μm and about 140 μm.

Figure 8B:
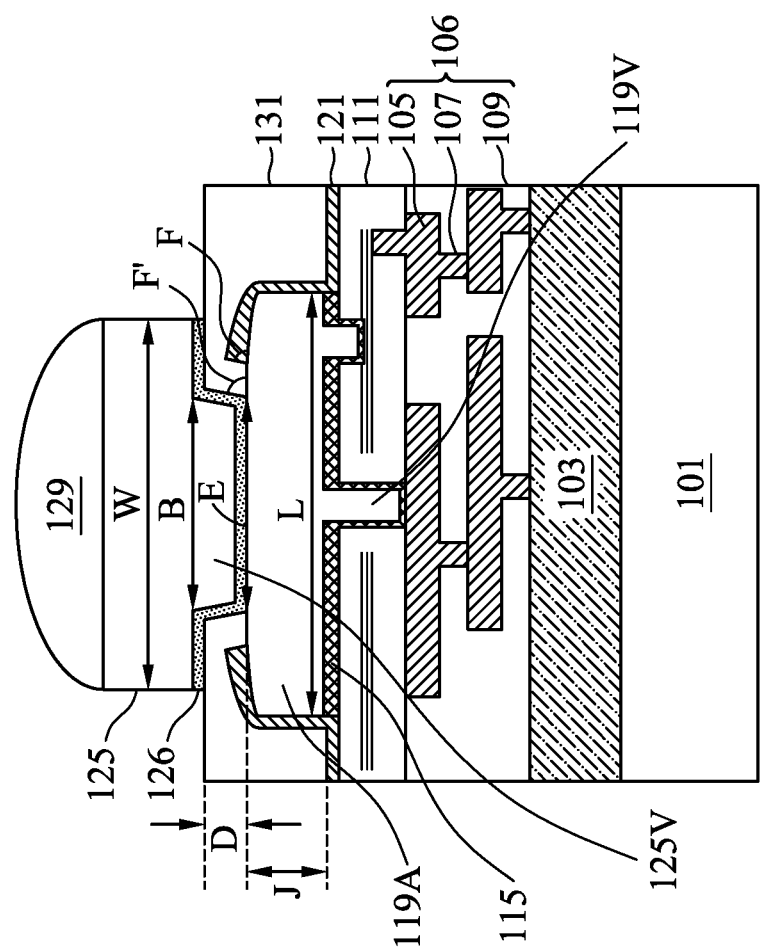

FIG. 8B illustrates a zoomed-in view of a portion of the semiconductor device 100 of FIG. 8A comprising a conductive bump 125. Dimensions of the conductive bump 125 and its surrounding structures are discussed below.

As illustrated in FIG. 8B, a width W of the conductive bump 125 (e.g., a C4 bump or a μ-bump) is between about 5 μm and about 90 μm. A width B at the top of the opening 132 in the dielectric layer 131 is between about 5 μm and about 22 μm for μ-bumps, and is between about 5 μm and about 78 μm for C4 bumps. Note that the width W in FIG. 8B is measured along the horizontal direction of FIG. 8B, the opening 132 has another width W2 measured along a direction perpendicular to the cross-section of FIG. 8B (e.g., coming out of the paper and along the longitudinal axis direction of the conductive line 118 in FIG. 16B), where the width W2 is between about 5 μm and about 36 μm for μ-bumps, and is between about 20 μm and about 40 μm for C4 bumps. A width E at the bottom of the opening 132 in the dielectric layer 131 is between about 5 μm and about 22 μm for μ-bumps, and is between about 5 μm and about 78 μm for C4 bumps. A height D for the bump via 125V is larger than the thickness A (see FIG. 8A) of the dielectric layer 131, and is larger than the thickness G (see FIG. 8A) of the passivation layer 121.

Still referring to FIG. 8B, a width L of the conductive pad 119 is between about 5 μm and about 45 μm if the conductive pad is the larger conductive pad 119A (e.g., with C4 bump formed thereon), or is between about 1.5 μm and about 10 μm if the conductive pad is the smaller conductive pad 119B (e.g., with a μ-bump formed thereon). A ratio between the width L of the conductive pad 119 and the spacing S (see FIG. 8A) is equal to or larger than one. A height J of the conductive pad 119 (or of the conductive line 118 in FIG. 16A) is between about 2 μm and about 6 μm. FIG. 8B further illustrates an angle F' between the sidewall of the dielectric layer 131 and the upper surface of the conductive pad 119, and an angle F between the sidewall of the passivation layer 121 and the upper surface of the conductive pad 119, where F may be between 10 degrees and 90 degrees (e.g., 10°<F<90°), and F' may be between 10 degrees and 90 degrees (e.g., 10°<F'<90°). If the opening (e.g., 136 in FIG. 10) in which the conductive bump 125 is formed is a lined-up opening, then the corresponding F and F' are equal. Otherwise, F may be different from F'.

Figure 8C:
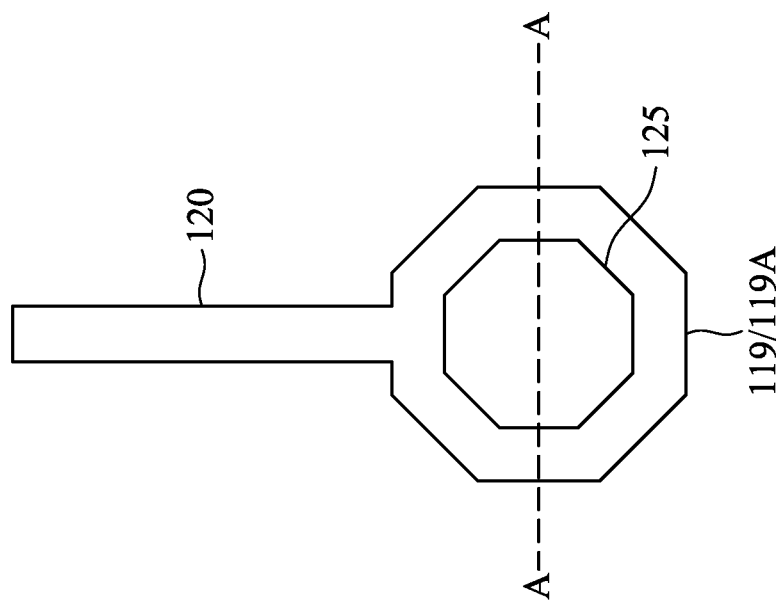

FIG. 8C illustrates a plan view of the semiconductor device 100 of FIG. 8B, and FIG. 8B corresponds to the cross-sectional view along cross-section A-A of FIG. 8C. Note that for simplicity, not all features are illustrated in FIG. 8C. The conductive pad 119 in FIG. 8C is illustrated to have an octagon shape as a non-limiting example. Other shapes, such as circle shape, oval shape, rectangular shape, other polygon shape, or the like, are also possible and are fully intended to be included within the scope of the current disclosure. The conductive bump 125 is illustrated to have a geometric similar shape as the conductive pad 119 in the example of FIG. 8C. In other embodiments, the conductive bump 125 and the conductive pad 119 have different shapes (e.g., non-geometric similar shapes). FIG. 8C further illustrates a conductive line 120 connected to the conductive pad 119. The conductive line 120 extends along the upper surface of the dielectric layer 131 and forms part of the redistribution layer with the conductive pads 119.

Figure 9:
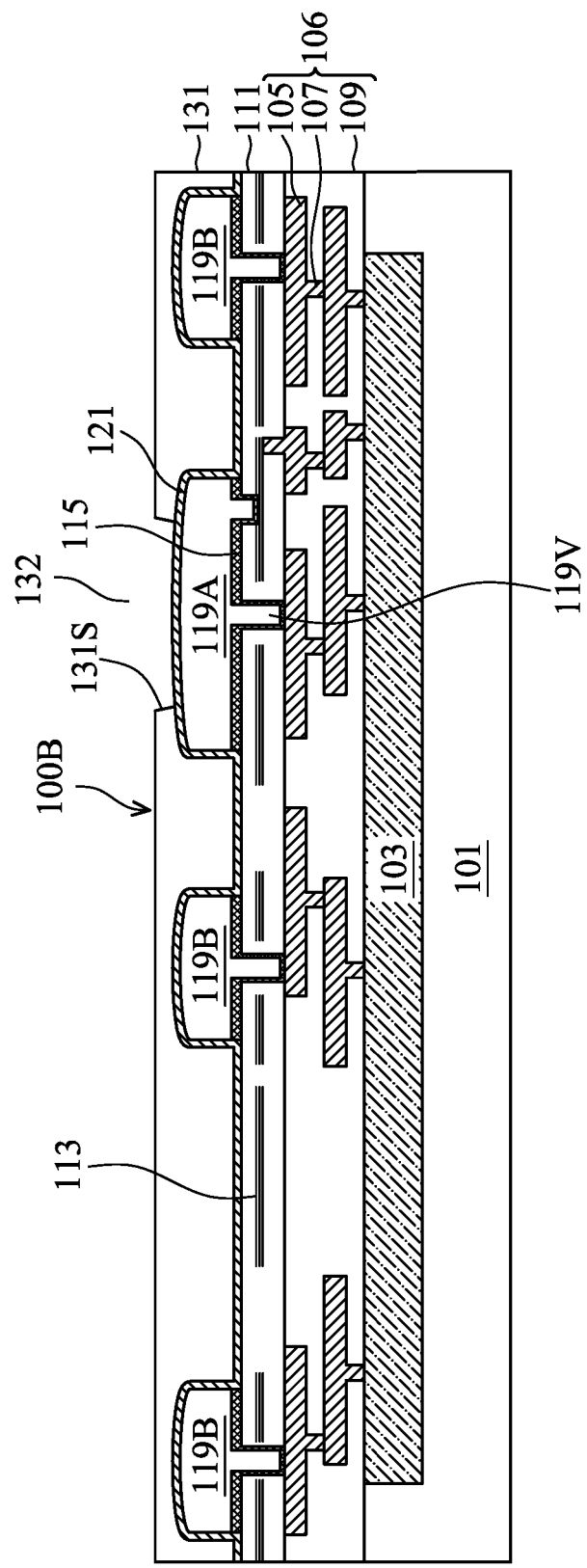
FIGS. 9-11 illustrate cross-sectional views of a semiconductor device at various stages of manufacturing, in accordance with another embodiment.
Figure 10:
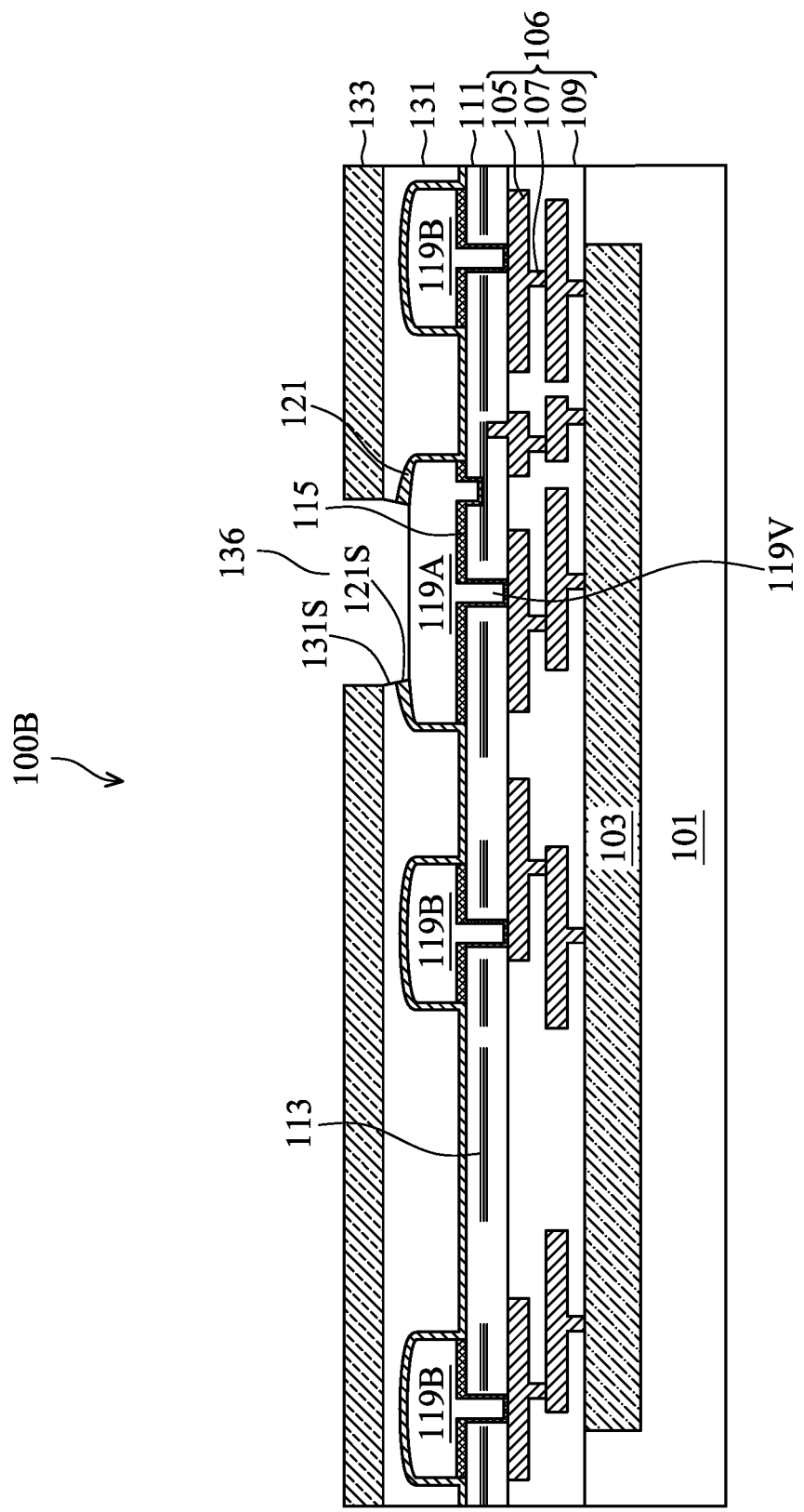
Figure 11:
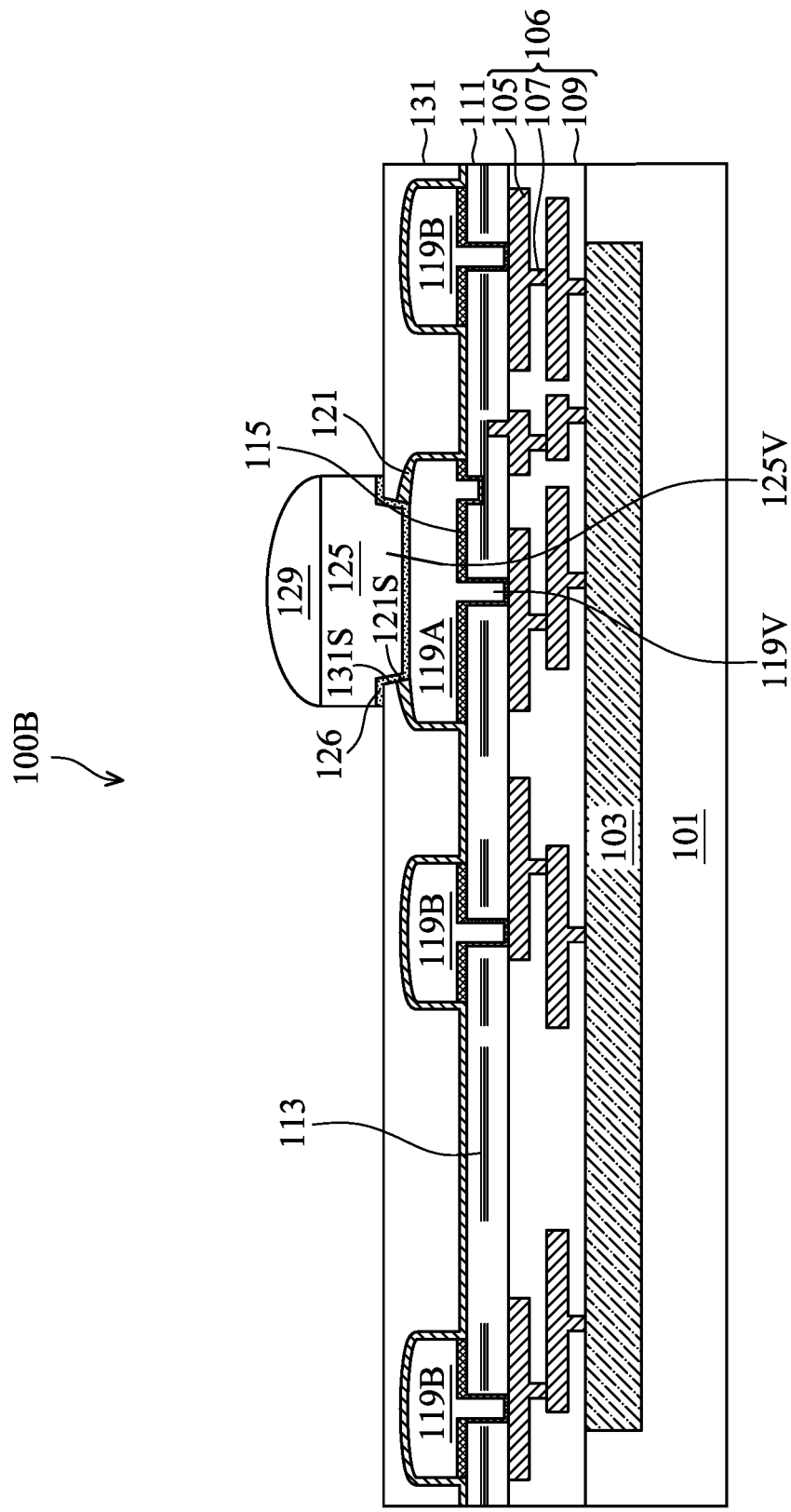

FIGS. 9-11 illustrate cross-sectional views of a semiconductor device 100B at various stages of manufacturing, in accordance with another embodiment. The semiconductor device 100B is similar to the semiconductor device 100 of FIG. 8A, but with lined-up openings 136 (see FIG. 10) for exposing the conductive pad 119A and for forming the conductive bump 125. The processing of FIG. 9 follows the processing of FIGS. 1A, 1B, and 2-5. In other words, FIGS. 1A, 1B, 2-5, and 9-11 illustrate the processing steps to form the semiconductor device 100B.

In FIG. 9, after the passivation layer 121 is formed, the dielectric layer 131 is formed over the passivation layer 121, and openings 132 are formed in the dielectric layer 131 to expose the passivation layer 121. Formation of the dielectric layer 131 and formation of the openings 132 may use the same or similar processing as discussed above with reference to FIG. 7, thus details are not repeated. Note that up to this stage of processing, no opening is formed in the passivation layer 121 over the conductive pad 119. Therefore, the upper surface of the conductive pad 119 is covered by the passivation layer 121.

Next, in FIG. 10, a patterned photoresist layer 133 is formed over the dielectric layer 131. An opening 136 of the patterned photoresist layer 133 overlies a respective opening 132 (see FIG. 9) of the dielectric layer 131. In some embodiments, a width of the opening 136, measured at the upper surface of the dielectric layer 131, is a same as a width of the opening 132 measured at the upper surface of the dielectric layer 131. In other embodiments, the width of the opening 136, measured at the upper surface of the dielectric layer 131, is larger than a width of the opening 132 measured at the upper surface of the dielectric layer 131. Next, the patterned photoresist layer 133 is used as an etching mask for a subsequent etching process, which subsequent etching process may be the same as or similar to the etching process in FIG. 6 to expose the conductive pad 119A. As illustrated in FIG. 10, after the etching process, the openings 136 is extend downward through the passivation layer 121, and the conductive pad 119A is exposed.

Still referring to FIG. 10, the opening 136 is formed as a lined-up opening. For each lined-up opening 136, the sidewall 131S of the dielectric layer 131 exposed by the opening 136 and a respective sidewall 121S of the passivation layer 121 exposed by the opening 136 are aligned along a same line (e.g., a straight line perpendicular to a major upper surface of the substrate 101, a slanted line with respect to the major upper surface of the substrate 101, or a curved line). In other words, a distance between opposing sidewalls of the opening 136 changes continuously (e.g., gradually without a step change) along a depth direction of the opening 136. The photoresist layer 133 is removed after the lined-up openings 136 are formed, e.g., by an ashing process.

Next, in FIG. 11, conductive bumps 125 are formed over the conductive pads 119, following the same or similar processing as FIG. 8A, details are not repeated. In the example of FIG. 11, upper sidewalls (e.g., upper portions of the sidewalls) of the bump via 125V contact and extend along sidewalls 131S of the dielectric layer 131, and lower sidewalls (e.g., lower portions of the sidewalls) of the bump via 125V contact and extend along sidewalls 121S of the passivation layer 121. In some embodiments, the bump via 125V has a width (e.g., measured between opposing sidewalls of the bump via 125V) that is constant (e.g., having straight sidewalls) or changes continuously (e.g., gradually without a step change) as the bump via 125V extends toward the substrate 101.

FIGS. 12-15, 16A, and 16B illustrate cross-sectional views of a semiconductor device 100C at various stages of manufacturing, in accordance with yet another embodiment. The semiconductor device 100C is similar to the semiconductor device 100B of FIG. 11, but with the conductive bumps 125 formed over conductive lines 118 instead of over conductive pads 119. The processing of FIG. 12 follows the processing of FIGS. 1A, 1B, and 2. In other words, FIGS. 1A, 1B, 2, 12-15, 16A and 16B illustrate the processing steps to form the semiconductor device 100C. Note that although semiconductor devices 100, 100B, and 100C are described as different embodiments, any combinations of the semiconductor devices 100, 100B, and 100C (e.g., 100 and 100C, or 100B and 100C) may be formed on a same substrate 101, e.g., in different regions of the same substrate 101.

Figure 12:
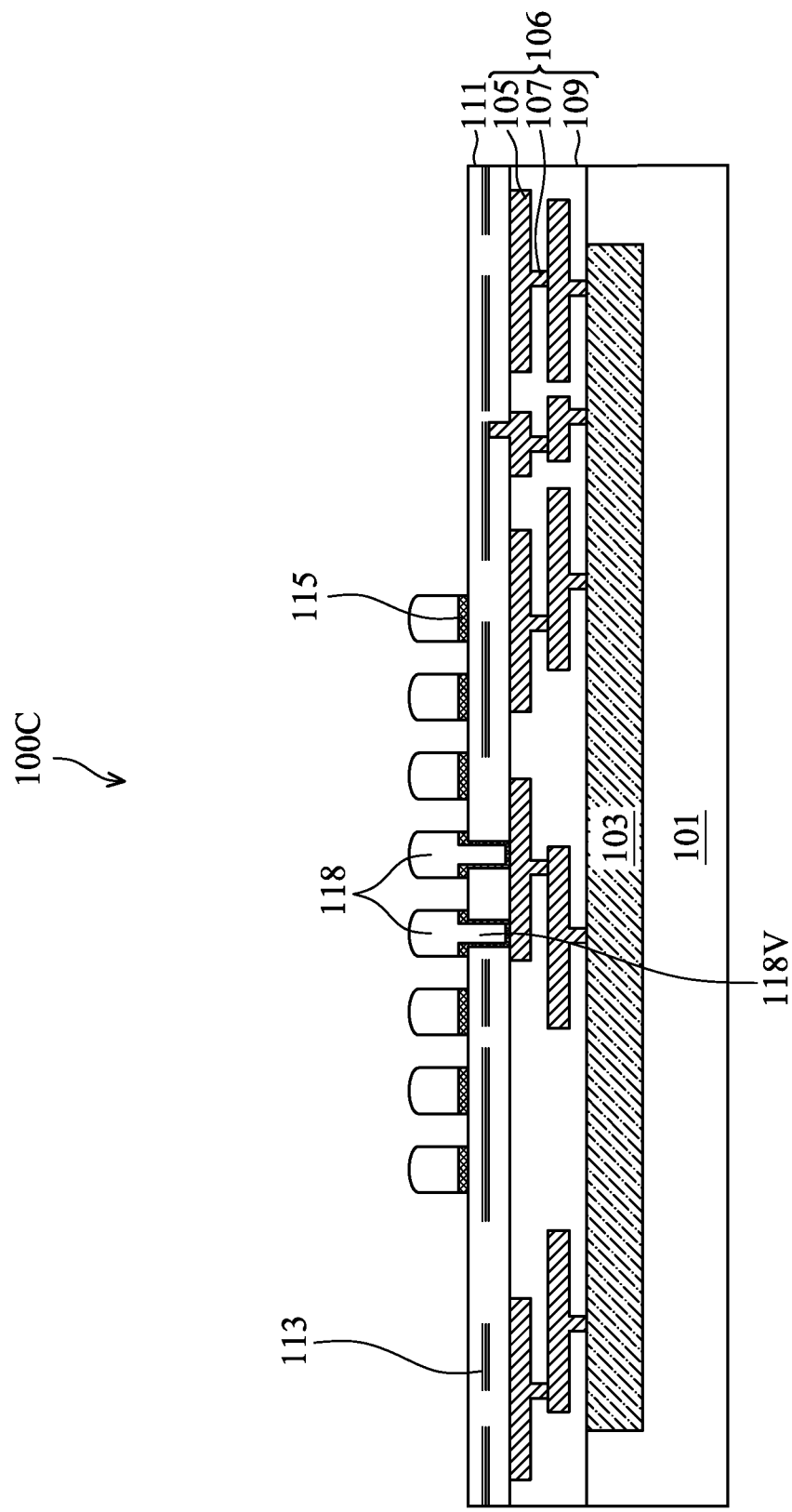
FIGS. 12-15, 16A, and 16B illustrate cross-sectional views of a semiconductor device at various stages of manufacturing, in accordance with yet another embodiment.

In FIG. 12, a plurality of conductive lines 118 are formed over the passivation layer 111, using similar processing as illustrated in FIG. 3. In some embodiments, to form the conductive lines 118, a patterned photoresist layer 137 (see, e.g., FIG. 3) is formed over the barrier layer 115, where locations of the patterns (e.g., openings) of the patterned photoresist layer 137 correspond to locations of subsequent formed conductive lines 118. Next, the descum processing 110 is performed. Next, an electrically conductive material (e.g., copper) is formed in the patterns of the patterned photoresist layer 137 over the barrier layer 115. Next, the patterned photoresist layer 137 is removed, and an etching process is performed to remove portions of the barrier layer 115 on which no electrically conductive material is formed.

Figure 13:
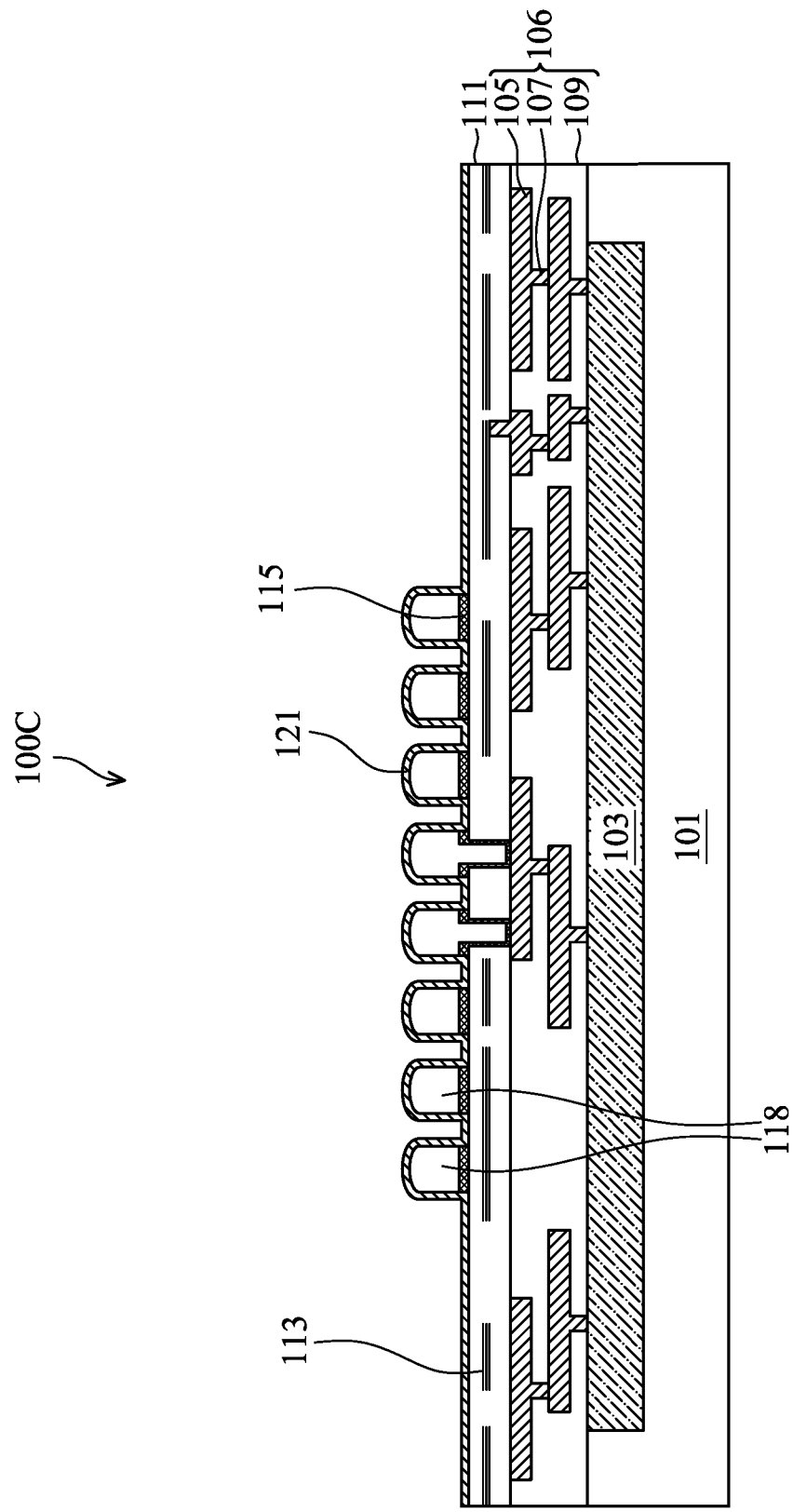

Next, in FIG. 13, the passivation layer 121 is formed conformally over the conductive lines 118 and over the passivation layer 111. The formation of the passivation layer 121 is the same as or similar to the processing discussed above with reference to FIG. 5, thus details are not repeated.

Figure 14:
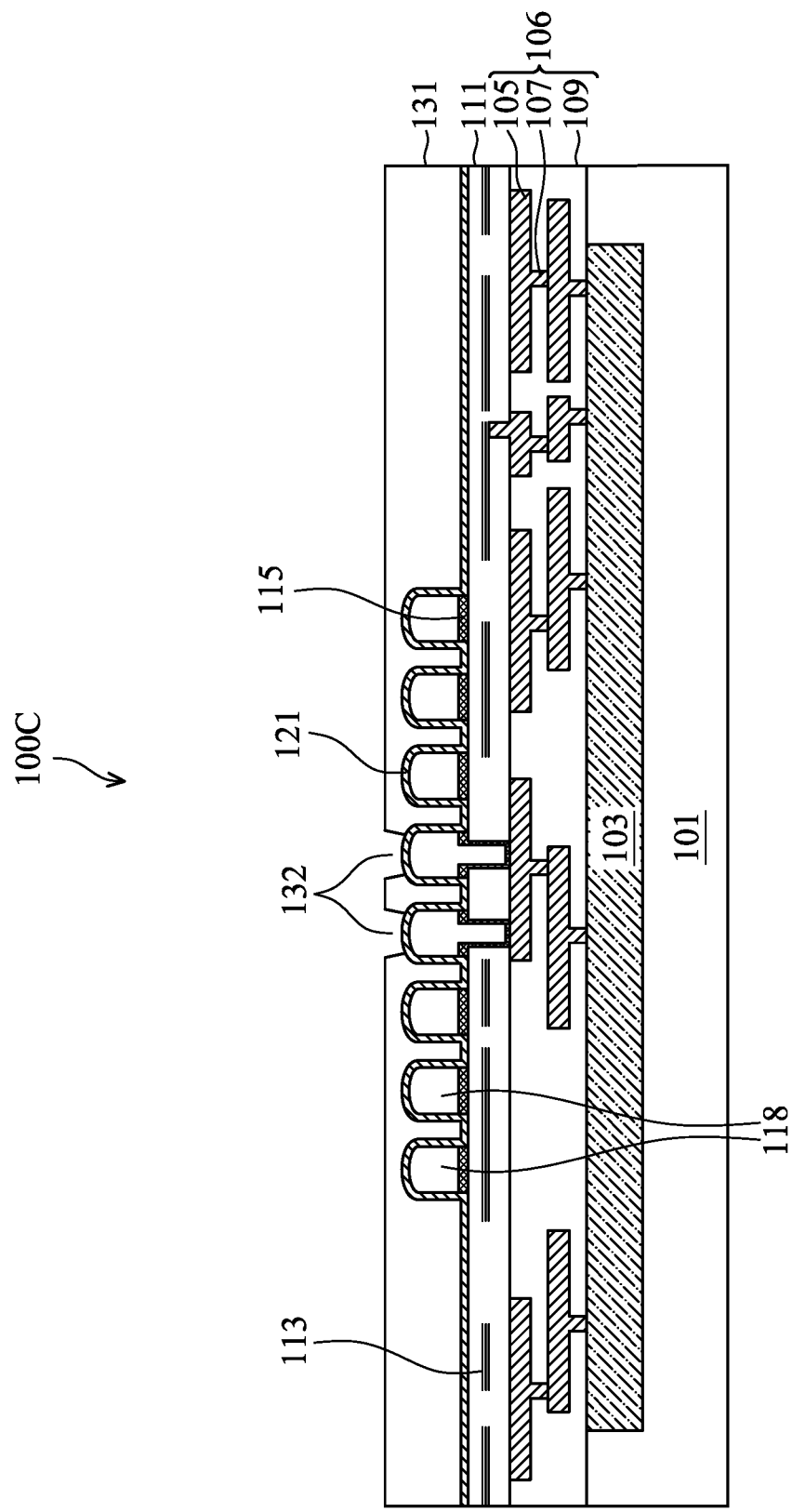

Next, in FIG. 14, the dielectric layer 131 is formed over the passivation layer 121, and openings 132 are formed in the dielectric layer 131 to expose the passivation layer 121 disposed over upper surfaces of conductive lines 118. The formation of the dielectric layer 131 and the openings 132 are the same as or similar to the processing discussed above with reference to FIG. 7, thus details are not repeated. Note that up to this stage of processing, no opening is formed in the passivation layer 121 to expose the conductive lines 118.

Figure 15:
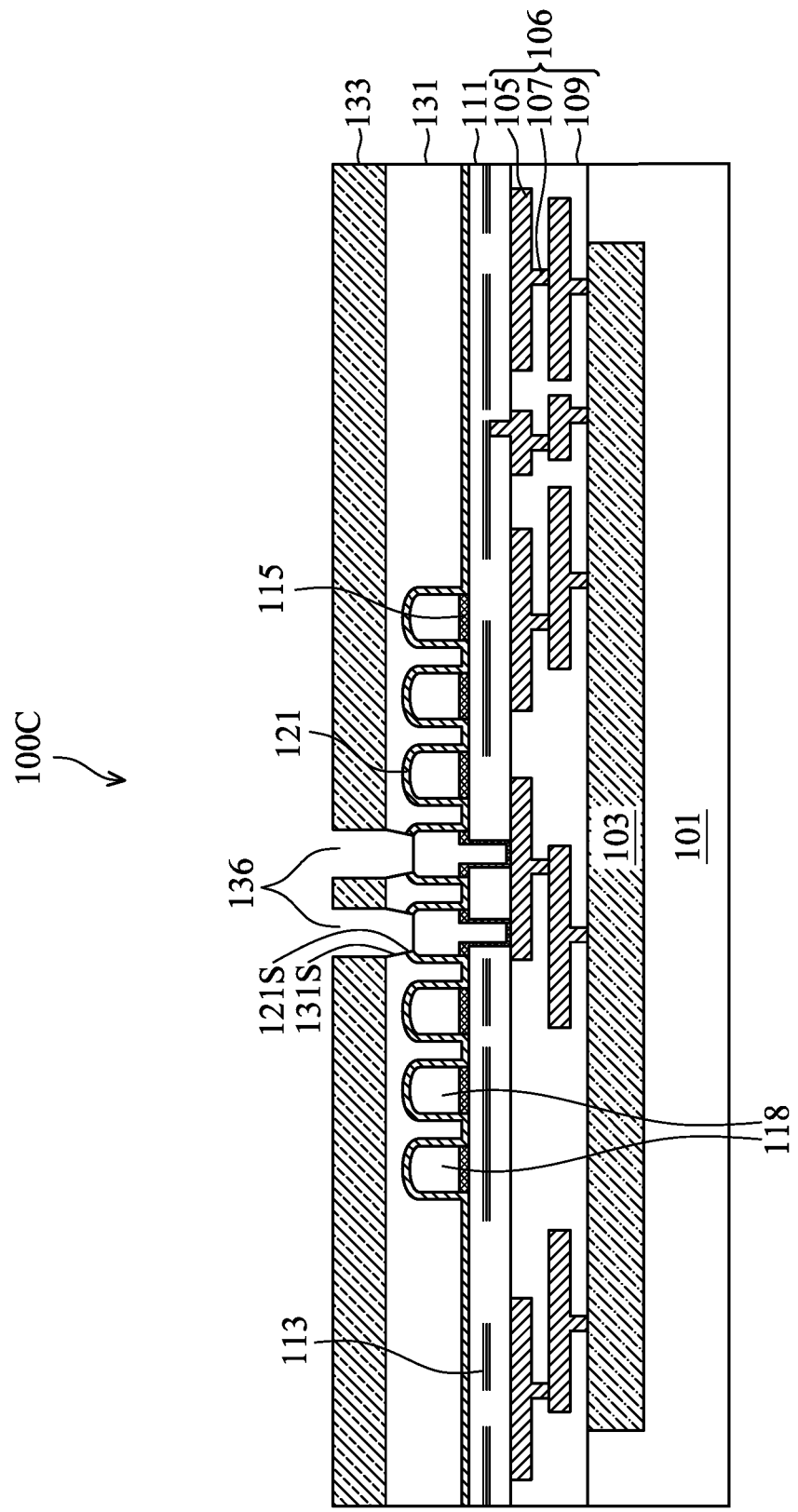

Next, in FIG. 15, a photoresist layer 133 is formed over the dielectric layer 131, and openings 136 are formed in the photoresist layer 133 overlying the openings 132 (see FIG. 14). Next, an etching process (e.g., an anisotropic etching process) is performed using the patterned photoresist layer 133 as an etching mask to extend the openings 136 downward, such that the openings 136 extend through the passivation layer 121 to expose the conductive lines 118. The etching process may be the same as or similar to the etching process discussed above with reference to FIG. 6, thus details are not repeated. Note that the opening 136 are lined-up openings, due to, e.g., the anisotropic etching process used to form the openings 136.

Figure 16A:
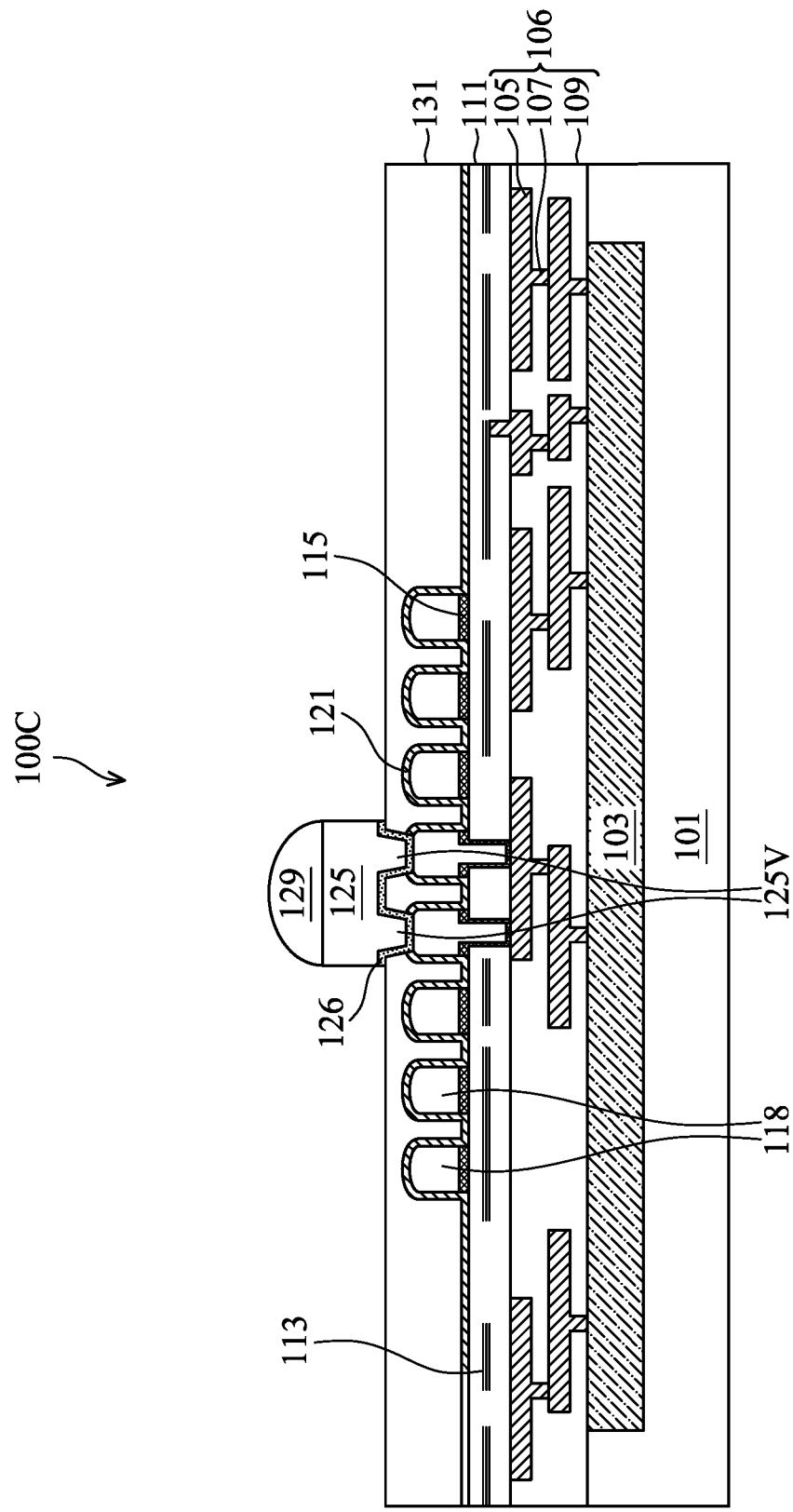

Next, in FIG. 16A, conductive bumps 125 are formed over the conductive lines 118, following the same or similar processing as FIG. 8A, details are not repeated. In the example of FIG. 16A, two bumps vias 125V are formed under the conductive bump 125, and electrically couple the conductive bump 125 to two underlying conductive lines 118. In other words, each of the bump via 125V extends into the dielectric layer 131, through the passivation layer 121, and contacts (e.g., physically contact) an underlying conductive line 118, thereby electrically coupling the conductive bump 125 with the underlying conductive line 118. The number of bump vias 125V under each conductive bump 125 and the number of conductive lines 118 electrically coupled to the overlying conductive bump 125 illustrated in FIG. 16A is merely a non-limiting example, any suitable number of bumps vias 125V and conductive lines 118 may be formed under each conductive bump 125.

As illustrated in FIG. 16A, upper sidewalls (e.g., upper portions of the sidewalls) of the bump via 125V contact and extend along sidewalls 131S of the dielectric layer 131, and lower sidewalls (e.g., lower portions of the sidewalls) of the bump via 125V contact and extend along sidewalls 121S of the passivation layer 121. In some embodiments, the bump via 125V has a width (e.g., measured between opposing sidewalls of the bump via 125V) that is constant (e.g., having straight sidewalls) or changes continuously (e.g., gradually without a step change) as the bump via 125V extends toward the substrate 101.

Figure 16B:
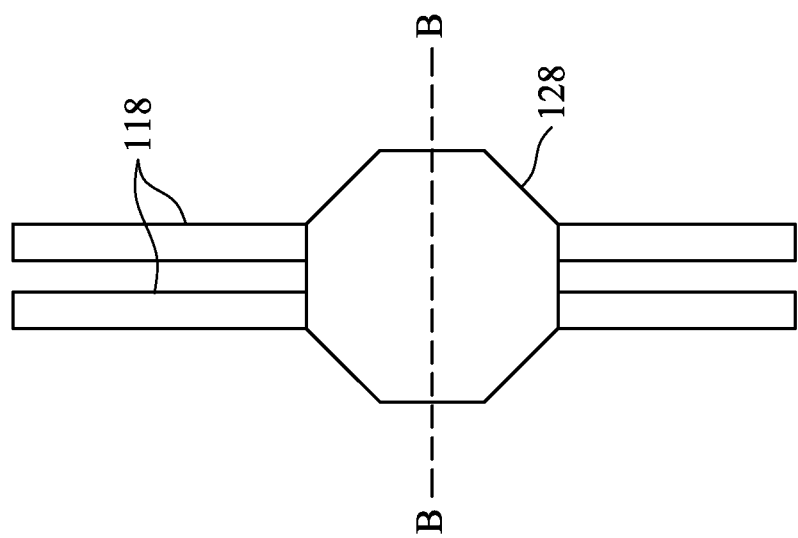

FIG. 16B illustrates a plan view of a portion of the semiconductor device 100C of FIG. 16A, and FIG. 16A corresponds to the cross-sectional view along cross-section B-B of FIG. 16B. Note that for simplicity, not all features are illustrated in FIG. 16B. The conductive bump 128 in FIG. 16B is illustrated to have an octagon shape as a non-limiting example. Other shapes, such as circle shape, oval shape, rectangular shape, other polygon shape, or the like, are also possible and are fully intended to be included within the scope of the current disclosure.

Variations or modifications to the disclosed embodiments are possible and are fully intended to be included within the scope of the present disclosure. For example, while the different embodiments 100A, 100B, and 100C are described as different semiconductor devices, the different structure/shape of the conductive bumps 125 disclosed in the embodiments 100A, 100B, and 100C may be formed in different regions of a same semiconductor device. In other words, a semiconductor device may have the different conductive bump structures disclosed in FIGS. 9A, 11, and 16A formed in different regions of the same semiconductor device.

Embodiments of the present disclosure achieve some advantageous features. For example, by forming pulled-in openings (see, e.g., 132 in FIG. 7) or lined-up opening (see, e.g., 136 in FIG. 10), the adhesion between the dielectric layer 131 and the passivation layer 121 is improved, and the mechanical stress in the device proximate to the interface between the dielectric layer 131 and the passivation layer 121 (e.g., at the lower corners of the dielectric layer 131 facing the openings) is reduced. The improved adhesive and reduced stress help to reduce or avoid delamination at the interface between the dielectric layer 131 and the passivation layer 121, thereby improving device performance, device reliability, and production yield. As another example, the formation of the dielectric layer 131 removes some of the difficulties associated with forming the conductive bumps 125 and improves device reliability and manufacturing yield. Recall that to form the conductive bump 125, the seed layer 126 is formed first, then the electrically conductive material is formed (e.g., plated) over the seed layer 126. Without the dielectric layer 131, the seed layer 126 would have to be formed conformally over the conductive pads 119 and/or over the conductive lines 118. In advanced semiconductor manufacturing, the small gaps between the conductive pads 119 or between the conductive lines 118 may have high aspect-ratios, and it may be difficult to form the seed layer 126 in these small gaps, which may result in the conductive bumps 125 not being formed properly. In addition, after the conductive bumps 125 are formed, portions of the seed layer 126 over which no conductive bump 125 is formed need to be removed. If such portions of the seed layer 126 are in the small gaps, it may be difficult to remove the seed layer 126, which may results in electrical short between conductive bumps 125. In contrast, with the dielectric layer 131 formed, the seed layer 126 is formed over the dielectric layer 131 and in the openings 132 or 136, which openings 132/136 have much smaller aspect-ratios, and therefore, the seed layer 126 can be easily formed in the openings and easily removed from the openings, thereby avoiding the issues discussed above.

Figure 17:
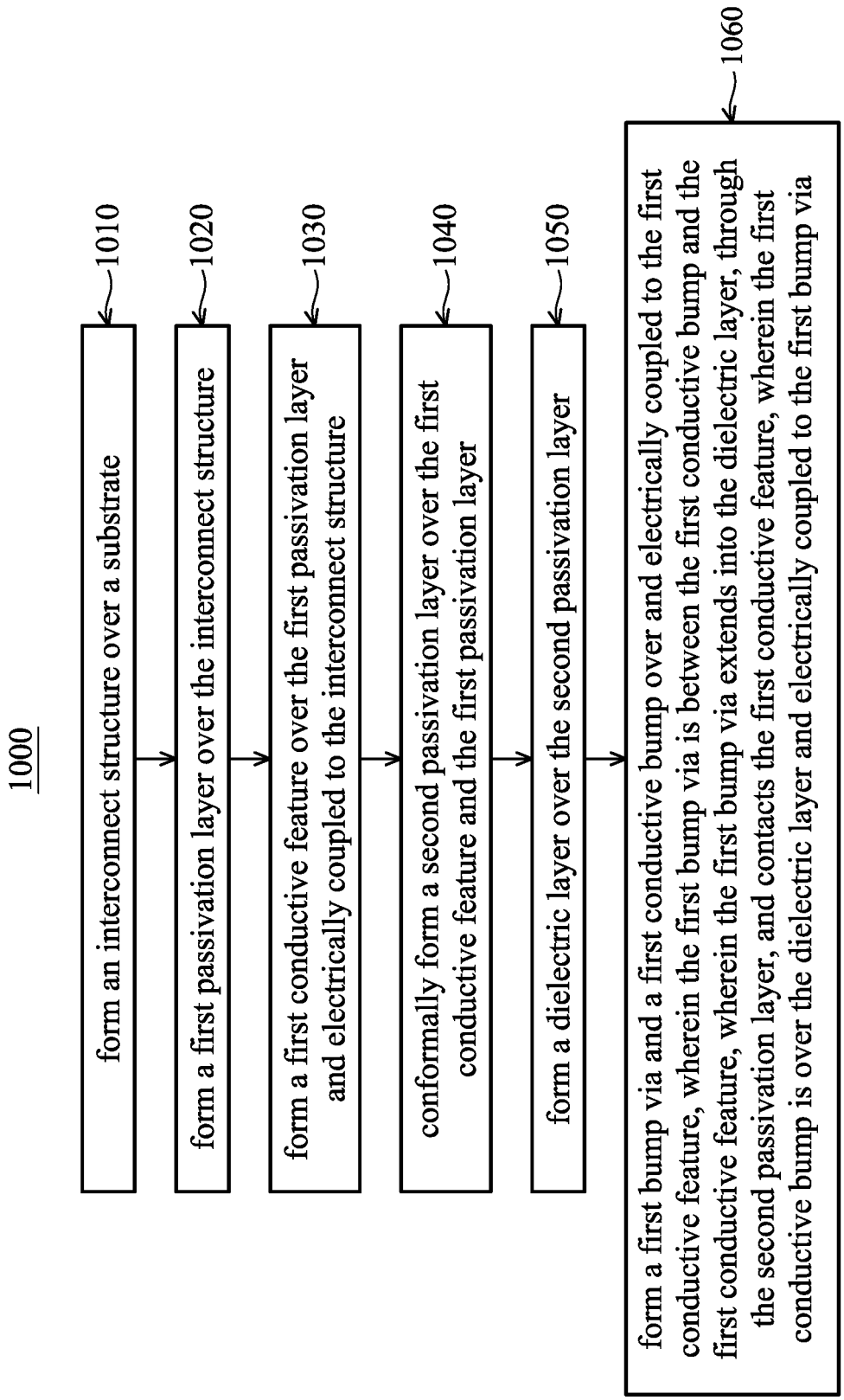
FIG. 17 illustrates a flow chart of a method of forming a semiconductor device, in accordance with some embodiments.

FIG. 17 illustrates a flow chart of a method 1000 of fabricating a semiconductor structure, in accordance with some embodiments. It should be understood that the embodiment method shown in FIG. 17 is merely an example of many possible embodiment methods. One of ordinary skill in the art would recognize many variations, alternatives, and modifications. For example, various steps as illustrated in FIG. 17 may be added, removed, replaced, rearranged, or repeated.

Referring to FIG. 17, at block 1010, an interconnect structure is formed over a substrate. At block 1020, a first passivation layer is formed over the interconnect structure. At block 1030, a first conductive feature is formed over the first passivation layer and electrically coupled to the interconnect structure. At block 1040, a second passivation layer is conformally formed over the first conductive feature and the first passivation layer. At block 1050, a dielectric layer is formed over the second passivation layer. At block 1060, a first bump via and a first conductive bump are formed over and electrically coupled to the first conductive feature, wherein the first bump via is between the first conductive bump and the first conductive feature, wherein the first bump via extends into the dielectric layer, through the second passivation layer, and contacts the first conductive feature, wherein the first conductive bump is over the dielectric layer and electrically coupled to the first bump via.

In accordance with an embodiment of the present disclosure, a method of forming a semiconductor device includes: forming an interconnect structure over a substrate; forming a first passivation layer over the interconnect structure; forming a first conductive feature over the first passivation layer and electrically coupled to the interconnect structure; conformally forming a second passivation layer over the first conductive feature and the first passivation layer; forming a dielectric layer over the second passivation layer; and forming a first bump via and a first conductive bump over and electrically coupled to the first conductive feature, wherein the first bump via is between the first conductive bump and the first conductive feature, wherein the first bump via extends into the dielectric layer, through the second passivation layer, and contacts the first conductive feature, wherein the first conductive bump is over the dielectric layer and electrically coupled to the first bump via.

In accordance with an embodiment of the present disclosure, a method of forming a semiconductor device includes: forming a first passivation layer over an interconnect structure, wherein the interconnect structure is over and electrically coupled to electrical components formed in a substrate; forming a conductive feature over the first passivation layer, wherein the conductive feature is electrically coupled to the interconnect structure; forming a second passivation layer over the conductive feature and the first passivation layer, wherein the second passivation layer is conformal and extends along exterior surfaces of the conductive feature; forming a dielectric layer over the second passivation layer, wherein an upper surface of the dielectric layer distal from the substrate extends further from the substrate than an upper surface of the conductive feature distal from the substrate; forming a bump via that extends from the upper surface of the dielectric layer to the upper surface of the conductive feature, wherein a width of the bump via changes continuously as the bump via extends toward the conductive feature; and forming a conductive bump on the bump via.

In accordance with an embodiment of the present disclosure, a semiconductor device includes: a substrate comprising a device region; an interconnect structure over the substrate and electrically coupled to the device region; a first passivation layer over the interconnect structure; a conductive feature over the first passivation layer and electrically coupled to the interconnect structure; a second passivation layer over the conductive feature and the first passivation layer, wherein the second passivation layer is conformal and extends along exterior surfaces of the conductive feature; a dielectric layer over the second passivation layer, wherein the dielectric layer extends further from the substrate than the conductive feature; a bump via in the dielectric layer, wherein the bump via extends from an upper surface of the dielectric layer distal from the substrate to the conductive feature, wherein a width of the bump via changes continuously as the bump via extends toward the conductive feature; and a conductive bump on the bump via.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:

forming an interconnect structure over a substrate;
forming a first passivation layer over the interconnect structure;
forming a first conductive feature over the first passivation layer and electrically coupled to the interconnect structure;
conformally forming a second passivation layer over the first conductive feature and the first passivation layer;
forming a dielectric layer over the second passivation layer; and
forming a first bump via and a first conductive bump over and electrically coupled to the first conductive feature, wherein the first bump via is between the first conductive bump and the first conductive feature, wherein the first bump via extends into the dielectric layer, through the second passivation layer, and contacts the first conductive feature, wherein the first conductive bump is over the dielectric layer and electrically coupled to the first bump via, wherein forming the first bump via and the first conductive bump comprises:
  after forming the dielectric layer, forming a first opening in the dielectric layer that extends into the dielectric layer to expose an upper surface of the second passivation layer distal from the substrate, wherein the second passivation layer exposed at a bottom of the first opening extends along and covers an upper surface of the first conductive feature;
  after forming the first opening, forming a patterned mask layer over the dielectric layer, wherein a second opening in the patterned mask layer overlies the first opening; and
  performing an anisotropic etching process using the patterned mask layer as an etching mask, wherein the anisotropic etching process extends the second opening through the second passivation layer to expose the upper surface of the first conductive feature.

2. The method of claim 1, wherein the dielectric layer surrounds the first conductive feature, and an upper surface of the dielectric layer distal from the substrate extends further from the substrate than the first conductive feature.

3. The method of claim 1, wherein after the anisotropic etching process, a sidewall of the dielectric layer facing the second opening is aligned along a same line with a respective sidewall of the second passivation layer facing the second opening.

4. The method of claim 1, further comprising, after the anisotropic etching process, forming a conductive material over the upper surface of the first conductive feature, wherein a first portion of the conductive material in the dielectric layer forms the first bump via, and a second portion of the conductive material over an upper surface of the dielectric layer forms the first conductive bump.

5. The method of claim 1, wherein the first conductive feature is a first conductive line.

6. The method of claim 5, wherein the method further comprises:
  forming a second conductive line over the first passivation layer adjacent to the first conductive line, wherein the second passivation layer is formed conformally over the second conductive line; and
  forming a second bump via between the first conductive bump and the second conductive line, wherein the second bump via extends into the dielectric layer, through the second passivation layer, and contacts the second conductive line, wherein the first conductive bump is electrically coupled to the first bump via and the second bump via.

7. The method of claim 1, further comprising forming a metal-insulator-metal (MIM) capacitor in the first passivation layer, wherein the first conductive feature is formed to be electrically coupled to the MIM capacitor.

8. A method of forming a semiconductor device, the method comprising:
  forming a first passivation layer over an interconnect structure, wherein the interconnect structure is over and electrically coupled to electrical components formed in a substrate;
  forming a first conductive feature and a second conductive feature over the first passivation layer, wherein the first conductive feature and the second conductive feature are electrically coupled to the interconnect structure;
  forming a second passivation layer over the first conductive feature, the second conductive feature, and the first passivation layer, wherein the second passivation layer is conformal and extends along exterior surfaces of the first conductive feature and the second conductive feature;
  forming a dielectric layer over the second passivation layer, wherein an upper surface of the dielectric layer distal from the substrate extends further from the substrate than an upper surface of the first conductive feature distal from the substrate;
  forming a first bump via that extends from the upper surface of the dielectric layer to the upper surface of the first conductive feature;
  forming a second bump via that extends from the upper surface of the dielectric layer to an upper surface of the second conductive feature distal from the substrate; and
  forming a conductive bump on the first bump via and the second bump via, wherein the conductive bump contacts the first bump via and the second bump via.

9. The method of claim 8, wherein an upper sidewall of the first bump via contacts and extends along a first sidewall of the dielectric layer facing the first bump via, and a lower sidewall of the first bump via contacts and extends along a second sidewall of the second passivation layer facing the first bump via.

10. The method of claim 9, wherein the first sidewall of the dielectric layer is aligned along a same line with the second sidewall of the second passivation layer.

11. The method of claim 8, further comprising forming a metal-insulator-metal (MIM) capacitor in the first passivation layer, wherein the first conductive feature is formed to be electrically coupled to the MIM capacitor.

12. The method of claim 8, wherein the first bump via and the second bump via are formed at a same time using a same material.

13. The method of claim 8, wherein the first conductive feature and the second conductive feature are conductive lines.

14. The method of claim 8, wherein a width of the first bump via changes continuously as the first bump via extends toward the first conductive feature.

15. The method of claim 8, wherein forming the first bump via comprises:
  after forming the dielectric layer, forming a first opening in the dielectric layer that exposes, at a bottom of the first opening, an upper surface of the second passivation layer distal from the substrate;
  after forming the first opening, forming a patterned mask layer over the dielectric layer, wherein a second opening in the patterned mask layer overlies the first opening; and performing an anisotropic etching process using the patterned mask layer as an etching mask, wherein the anisotropic etching process extends the second opening through the second passivation layer to expose the upper surface of the first conductive feature.

16. The method of claim 15, further comprising, after the anisotropic etching process, forming a conductive material over the upper surface of the first conductive feature, wherein a first portion of the conductive material in the dielectric layer forms the first bump via, and a second portion of the conductive material over an upper surface of the dielectric layer forms the first conductive bump.

17. The method of claim 15, wherein sidewalls of the second opening are aligned with respective sidewalls of the first opening.

18. A method of forming a semiconductor device, the method comprising:
    forming an interconnect structure over a substrate and electrically coupled to a device region of the substrate;
    forming a first passivation layer over the interconnect structure;
    forming a first conductive feature over an upper surface of the first passivation layer and electrically coupled to the interconnect structure;
    conformally forming a second passivation layer over the first conductive feature and the first passivation layer;
    forming a dielectric layer over the second passivation layer;
    etching the dielectric layer to form a first opening in the dielectric layer over the first conductive feature, wherein the etching is stopped when the second passivation layer is exposed such that after the etching, the second passivation layer lines a bottom of the first opening;
    forming a patterned mask layer over the dielectric layer, wherein a second opening in the patterned mask layer overlies the first opening;
    performing an anisotropic etching process to extend the second opening through the dielectric layer and the second passivation layer to expose the first conductive feature;
    forming a first bump via in the second opening and electrically coupled to the first conductive features; and
    forming a conductive bump over and electrically coupled to the first bump via.

19. The method of claim 18, wherein before performing the anisotropic etching process, a second width of the second opening in the patterned mask layer, measured at an interface between the patterned mask layer and the dielectric layer, is the same as a first width of the first opening measured at the interface.

20. The method of claim 18, wherein the first conductive feature is a first conductive line extending along the upper surface of the first passivation layer, wherein the method further comprises:
    forming a second conductive line over the upper surface of the first passivation layer and adjacent to the first conductive line;
    forming a third opening through the dielectric layer and the second passivation layer to expose the second conductive line; and
    forming a second bump via in the third opening and electrically coupled to the second conductive line, wherein the conductive bump is formed over and electrically coupled to the first bump via and the second bump via.

* * * * *